(12) United States Patent
Parthasarathy et al.

(10) Patent No.: US 12,068,721 B2
(45) Date of Patent: Aug. 20, 2024

(54) MONOLITHIC MICROWAVE INTEGRATED CIRCUITS TOLERANT TO ELECTRICAL OVERSTRESS

(71) Applicant: Analog Devices International Unlimited Company, Limerick (IE)

(72) Inventors: Srivatsan Parthasarathy, Acton, MA (US); Javier A. Salcedo, North Billerica, MA (US); Miguel Chanca, Valencia (ES)

(73) Assignee: Analog Devices International Unlimited Company, Limerick (IE)

( * ) Notice: Subject to any disclaimer, the term of this patent is extended or adjusted under 35 U.S.C. 154(b) by 184 days.

(21) Appl. No.: 17/930,172

(22) Filed: Sep. 7, 2022

(65) Prior Publication Data

US 2022/0416731 A1    Dec. 29, 2022

Related U.S. Application Data

(62) Division of application No. 16/840,097, filed on Apr. 3, 2020, now Pat. No. 11,469,717.

(Continued)

(51) Int. Cl.
*H01L 27/02* (2006.01)
*H01L 27/06* (2006.01)
(Continued)

(52) U.S. Cl.
CPC ......... *H03F 1/523* (2013.01); *H01L 27/0288* (2013.01); *H01L 27/0629* (2013.01);
(Continued)

(58) Field of Classification Search
CPC ............................. H01L 27/0288; H03F 1/523
See application file for complete search history.

(56) References Cited

U.S. PATENT DOCUMENTS

| | | |
|---|---|---|
| 3,914,757 A | 10/1975 | Finlay et al. |
| 5,477,188 A | 12/1995 | Chawla et al. |

(Continued)

FOREIGN PATENT DOCUMENTS

EP    1983572 A1    10/2008

OTHER PUBLICATIONS

Office Action issued for Chinese Application No. 202010364079.1 dated Oct. 27, 2023 in 5 pages.

(Continued)

*Primary Examiner* — Patricia T Nguyen
(74) *Attorney, Agent, or Firm* — Knobbe, Martens, Olson & Bear, LLP

(57) ABSTRACT

Monolithic microwave integrated circuits (MMICs) tolerant to electrical overstress are provided. In certain embodiments, a MMIC includes a signal pad that receives a radio frequency (RF) signal, and an RF circuit coupled to the RF signal pad. The RF circuit includes a transistor layout, an input field-effect transistor (FET) implemented using a first portion of a plurality of gate fingers of the transistor layout, and an embedded protection device electrically connected between a gate and a source of the input FET and implemented using a second portion of the plurality of gate fingers. The MMIC is tolerant to electrical overstress events, such as field-induced charged-device model (FICDM) events.

20 Claims, 23 Drawing Sheets

Related U.S. Application Data

(60) Provisional application No. 62/843,152, filed on May 3, 2019.

(51) Int. Cl.
  *H01L 29/20* (2006.01)
  *H01L 29/205* (2006.01)
  *H01L 29/778* (2006.01)
  *H01L 29/872* (2006.01)
  *H03F 1/02* (2006.01)
  *H03F 1/52* (2006.01)
  *H03F 3/195* (2006.01)

(52) U.S. Cl.
  CPC ........ *H01L 29/2003* (2013.01); *H01L 29/205* (2013.01); *H01L 29/7786* (2013.01); *H01L 29/872* (2013.01); *H03F 1/0211* (2013.01); *H03F 3/195* (2013.01); *H03F 2200/06* (2013.01); *H03F 2200/294* (2013.01); *H03F 2200/426* (2013.01); *H03F 2200/451* (2013.01)

(56) References Cited

U.S. PATENT DOCUMENTS

| | | |
|---|---|---|
| 6,525,609 B1 | 2/2003 | Behzad |
| 6,693,339 B1 | 2/2004 | Khemka et al. |
| 6,933,546 B2 | 8/2005 | Khemka et al. |
| 6,985,002 B2 | 1/2006 | Salcedo |
| 7,202,114 B2 | 4/2007 | Salcedo et al. |
| 7,285,828 B2 | 10/2007 | Salcedo et al. |
| 7,309,638 B2 | 12/2007 | Khemka et al. |
| 7,368,786 B2 | 5/2008 | Xu et al. |
| 7,479,414 B2 | 1/2009 | Salcedo et al. |
| 7,498,664 B2 | 3/2009 | Ito et al. |
| 7,566,914 B2 | 7/2009 | Salcedo et al. |
| 7,601,991 B2 | 10/2009 | Salcedo et al. |
| 7,868,387 B2 | 1/2011 | Salcedo et al. |
| 7,985,640 B2 | 7/2011 | Salcedo et al. |
| 8,044,457 B2 | 10/2011 | Salcedo et al. |
| 8,213,142 B2 | 7/2012 | Worley |
| 8,222,698 B2 | 7/2012 | Salcedo et al. |
| 8,258,016 B2 | 9/2012 | Ito et al. |
| 8,283,695 B2 | 10/2012 | Salcedo et al. |
| 8,576,005 B2 | 1/2013 | Liao et al. |
| 8,368,116 B2 | 2/2013 | Salcedo et al. |
| 8,432,651 B2 | 4/2013 | Salcedo et al. |
| 8,441,104 B1 | 5/2013 | Hu et al. |
| 8,482,889 B2 | 7/2013 | Huang et al. |
| 8,489,035 B2 | 7/2013 | Chiang et al. |
| 8,519,432 B2 | 8/2013 | Barrow et al. |
| 8,525,299 B2 | 9/2013 | Hu et al. |
| 8,564,065 B2 | 10/2013 | Donovan et al. |
| 8,610,251 B1 | 12/2013 | Salcedo |
| 8,629,727 B2 | 1/2014 | Sutardja et al. |
| 8,637,899 B2 | 1/2014 | Salcedo |
| 8,665,571 B2 | 3/2014 | Salcedo et al. |
| 8,680,620 B2 | 3/2014 | Salcedo et al. |
| 8,796,729 B2 | 8/2014 | Clarke et al. |
| 8,829,570 B2 | 9/2014 | Parthasarathy et al. |
| 8,860,080 B2 | 10/2014 | Salcedo |
| 8,928,085 B2 | 1/2015 | Salcedo et al. |
| 8,946,822 B2 | 2/2015 | Salcedo et al. |
| 8,947,841 B2 | 2/2015 | Salcedo et al. |
| 8,971,832 B2 | 3/2015 | Bult et al. |
| 9,006,781 B2 | 4/2015 | Salcedo et al. |
| 9,006,782 B2 | 4/2015 | Salcedo |
| 9,076,807 B2 | 7/2015 | Parthasarathy et al. |
| 9,088,256 B2 | 7/2015 | Cosgrave et al. |
| 9,123,540 B2 | 9/2015 | Salcedo et al. |
| 9,147,677 B2 | 9/2015 | Salcedo et al. |
| 9,171,832 B2 | 10/2015 | Salcedo et al. |
| 9,275,991 B2 | 3/2016 | Salcedo et al. |
| 9,293,912 B2 | 3/2016 | Parthasarathy et al. |
| 9,356,011 B2 | 5/2016 | Clarke et al. |
| 9,362,265 B2 | 6/2016 | Salcedo et al. |
| 9,438,033 B2 | 9/2016 | Parthasarathy et al. |
| 9,478,608 B2 | 10/2016 | Salcedo et al. |
| 9,634,482 B2 | 4/2017 | Parthasarathy et al. |
| 9,673,187 B2 | 6/2017 | Salcedo et al. |
| 9,831,233 B2 | 11/2017 | Salcedo et al. |
| 9,831,666 B2 | 11/2017 | Parthasarathy et al. |
| 9,871,373 B2 | 1/2018 | O'donnell et al. |
| 9,929,142 B2 | 3/2018 | Ivanov et al. |
| 9,954,356 B2 | 4/2018 | Parthasarathy et al. |
| 10,008,490 B2 | 6/2018 | Salcedo et al. |
| 10,068,894 B2 | 9/2018 | Zhao et al. |
| 10,158,029 B2 | 12/2018 | Parthasarathy et al. |
| 10,177,566 B2 | 1/2019 | Zhao et al. |
| 10,199,369 B2 | 2/2019 | Parthasarathy et al. |
| 10,249,609 B2 | 4/2019 | Salcedo et al. |
| 10,319,714 B2 | 6/2019 | Luo et al. |
| 10,404,059 B2 | 9/2019 | Salcedo et al. |
| 10,529,518 B2 | 1/2020 | Fitzgerald et al. |
| 10,557,881 B2 | 2/2020 | O'donnell et al. |
| 10,566,409 B2 | 2/2020 | Lesenco et al. |
| 10,581,423 B1 | 3/2020 | Parthasarathy et al. |
| 10,608,431 B2 | 3/2020 | He et al. |
| 10,700,056 B2 | 6/2020 | Zhao et al. |
| 11,469,717 B2 | 10/2022 | Parthasarathy et al. |
| 2004/0160717 A1* | 8/2004 | May .................... H01L 27/0266 361/91.5 |
| 2005/0029540 A1* | 2/2005 | Kodama ................ H01L 29/78 257/173 |
| 2007/0296055 A1 | 12/2007 | Yen et al. |
| 2009/0002094 A1 | 1/2009 | Radtke |
| 2012/0176708 A1 | 7/2012 | Tsai |
| 2013/0300487 A1 | 11/2013 | Barrow et al. |
| 2015/0130539 A1 | 5/2015 | Gorbachov |
| 2017/0194317 A1* | 7/2017 | Wallis .................... H01L 24/04 |
| 2017/0256534 A1* | 9/2017 | Parthasarathy ..... H01L 27/0259 |
| 2018/0026440 A1 | 1/2018 | Zhao et al. |
| 2018/0158814 A1 | 6/2018 | Salcedo et al. |
| 2018/0211951 A1* | 7/2018 | Luo .................... H01L 27/0277 |
| 2018/0226367 A1 | 8/2018 | Babcock et al. |
| 2020/0158771 A1 | 5/2020 | O'donnell et al. |
| 2020/0227914 A1 | 7/2020 | Salcedo et al. |
| 2022/0020872 A1* | 1/2022 | De Vleeschouwer ....................... H01L 27/085 |

OTHER PUBLICATIONS

Borremans et al. "A Fully Integrated 7.3 kV HBM ESD-Protected Transformer-Based 4.5-6 Ghz CMOS LNA" IEEE Journal of Solid-State Circuits, vol. 44, No. 2, Feb. 2009, in 10 pages.

Hsiao et al. "A 5-Ghz Differential Low-Noise Amplifier with High Pin-To-Pin ESD Robustness in a 130-nm CMOS Process" IEEE Transactions on Microwave Theory and Techniques, vol. 57, No. 5, May 2009 in 10 pages.

Ker et al. "Overview on ESD Protection Designs of Low-Parasitic Capacitance for RF Ics in CMOS Technologies" IEEE Transactions on Device and Materials Reliability, vol. 11, No. 2, Jun. 2011 in 12 pages.

Lin et al. "Design and Implementation of Configurable ESD Protection Cell for 60-Ghz RF Circuits In a 65-nm CMOS Process" Microelectronics Reliability Aug. 2011 in 10 pages.

Thijs et al. "Inductor-based ESD protection under CDM-like ESD stress conditions for RF applications" 2008 IEEE Custom Integrated Circuits Conference in 4 pages.

* cited by examiner

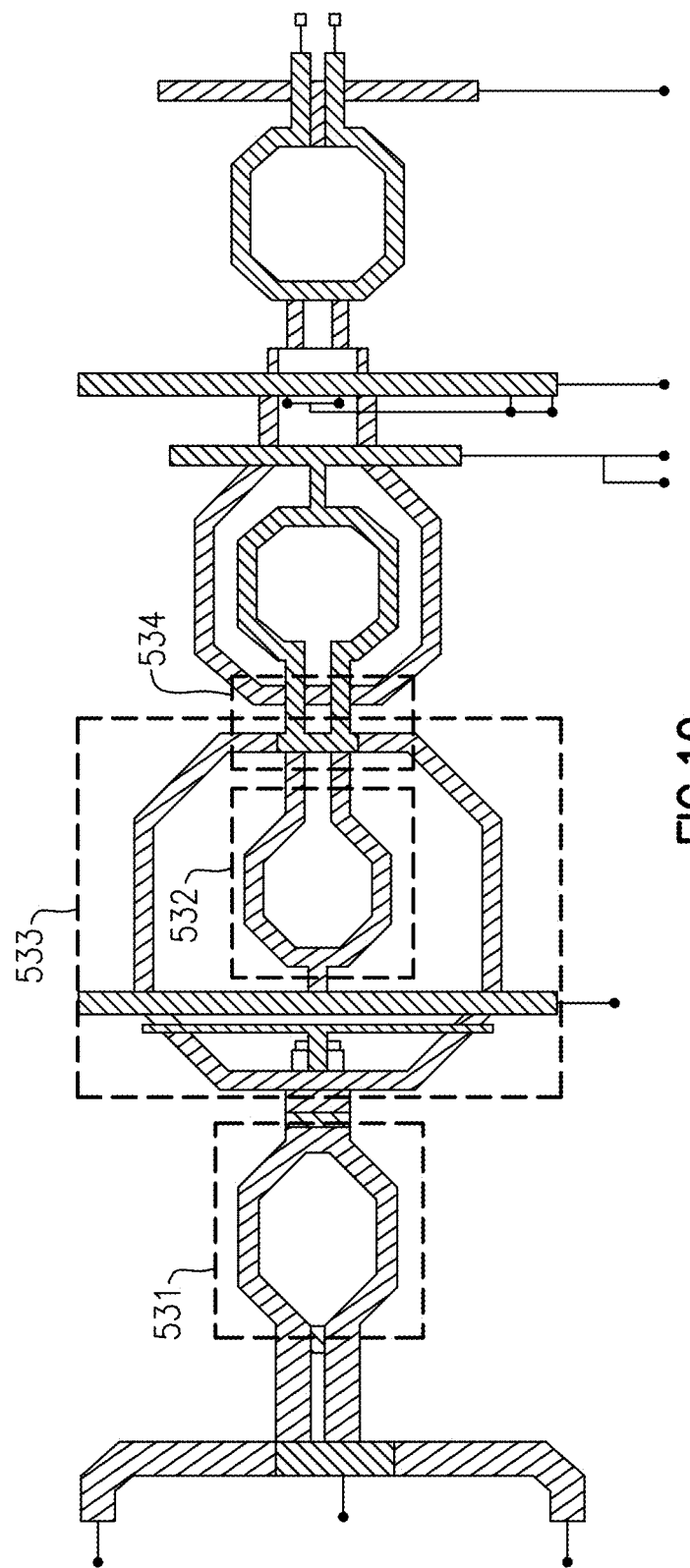

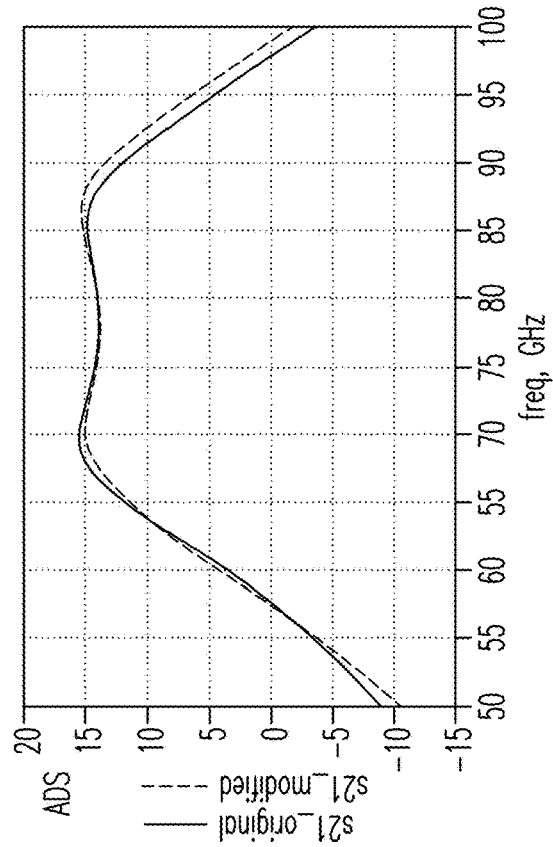
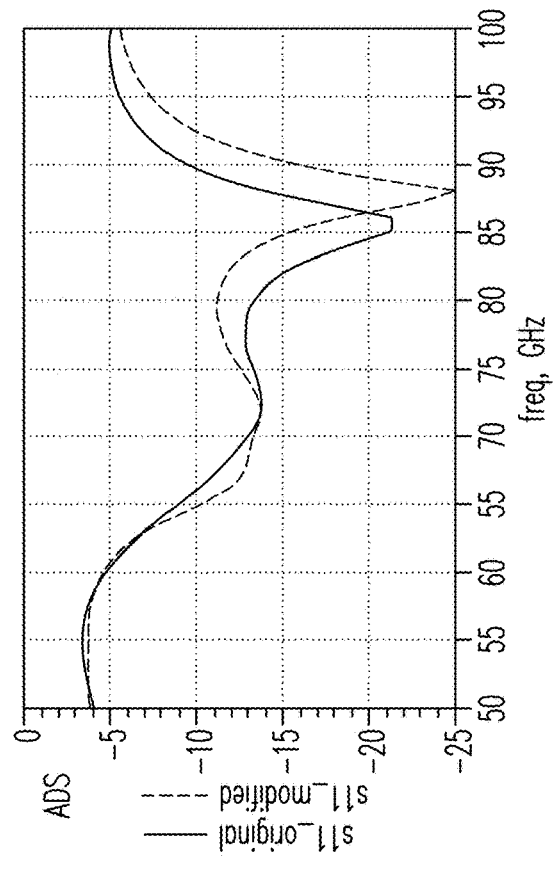
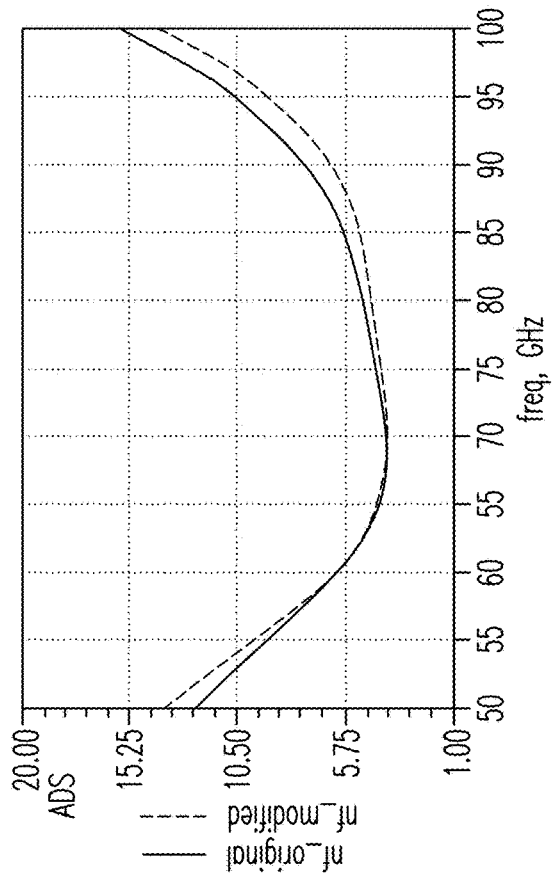
FIG. 16

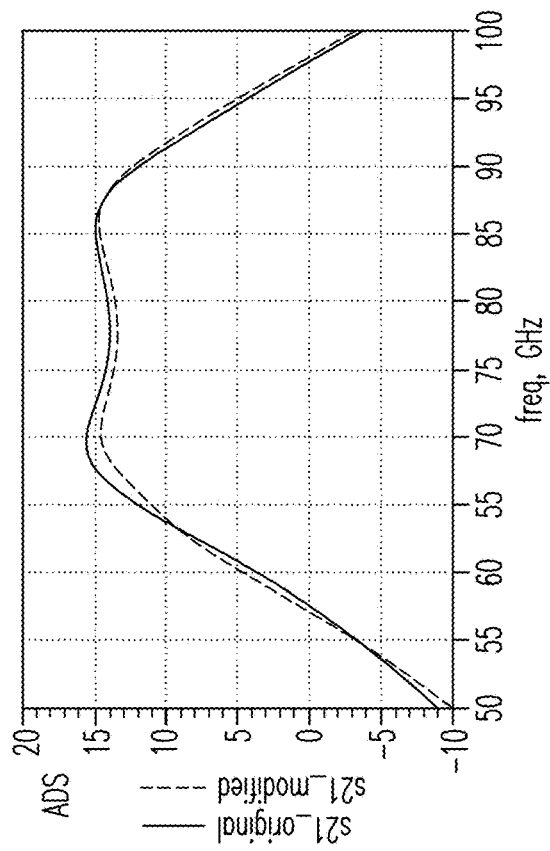
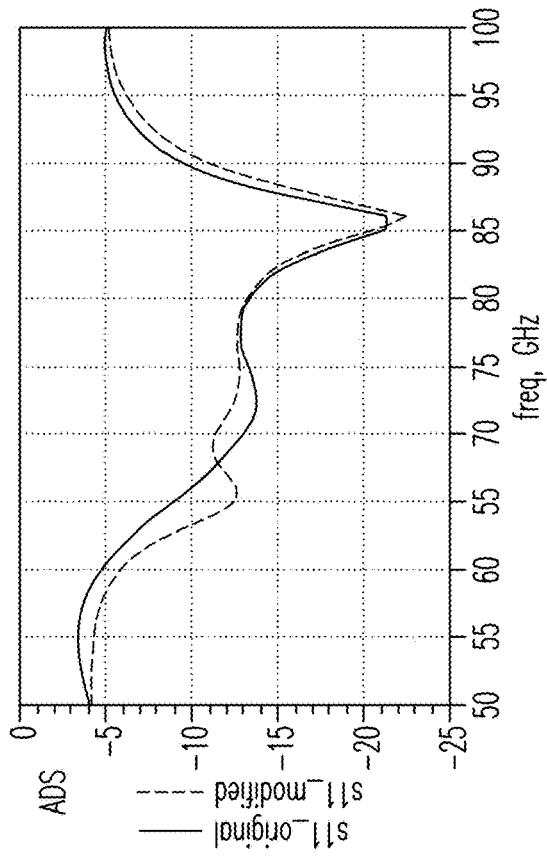
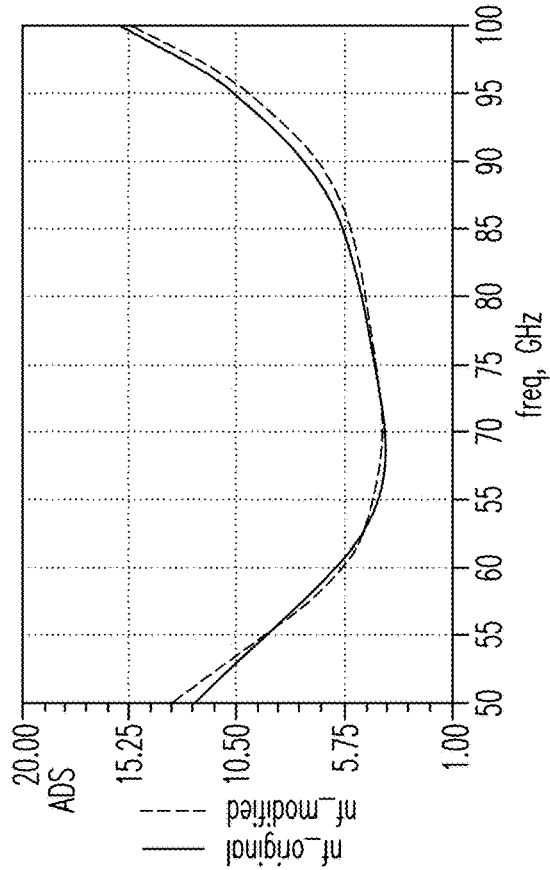
FIG. 17

MONOLITHIC MICROWAVE INTEGRATED CIRCUITS TOLERANT TO ELECTRICAL OVERSTRESS

CROSS-REFERENCE TO RELATED APPLICATIONS

The present application claims priority to U.S. patent application Ser. No. 16/840,097, filed Apr. 3, 2020, and titled "MICROWAVE AMPLIFIERS TOLERANT TO ELECTRICAL OVERSTRESS," which claims priority to U.S. Provisional Patent Application No. 62/843,152, filed May 3, 2019, and titled "MICROWAVE AMPLIFIERS TOLERANT TO ELECTRICAL OVERSTRESS," the entirety of which is hereby incorporated herein by reference.

FIELD OF THE DISCLOSURE

Embodiments of the invention relate to microwave and millimeter wave integrated circuit electronic systems, and more particularly to, low noise amplifier interfaces with electrical overstress protection.

BACKGROUND

Certain electronic systems can be exposed to electrical overstress events, or electrical signals of short duration having rapidly changing voltage and high power. Electrical overstress events include, for example, electrical overstress (EOS) and electrostatic discharge (ESD) arising from the abrupt release of charge from an object or person to an electronic system.

Electrical overstress events can damage or destroy integrated circuits (ICs) by generating overvoltage conditions and high levels of power dissipation in relatively small areas of the ICs. High power dissipation can increase IC temperature, and can lead to numerous problems, such as gate oxide punch-through, junction damage, metal damage, and surface charge accumulation.

SUMMARY OF THE DISCLOSURE

Microwave amplifiers tolerant to electrical overstress are provided. In certain embodiments, a monolithic microwave integrated circuit (MMIC) includes a signal pad that receives a radio frequency (RF) signal, a ground pad, a balun including a primary section that receives the RF signal and a secondary section that outputs a differential RF signal, an amplifier that amplifies the differential RF signal, and a protection inductor electrically connected between the primary section and the ground pad and operable to protect the amplifier from electrical overstress. Such electrical overstress events include not only electrostatic discharge (ESD) events, but other types of overstress, such as field-induced charged-device model (FICDM) events. For example, the protection inductor operates as a shunt inductor to the primary section of the balun, and serves to reduce overstress stress during short duration overstress events.

In one aspect, a monolithic microwave integrated circuit (MMIC) with integrated electrical overstress protection is provided. The MMIC includes a signal pad configured to receive a radio frequency (RF) signal, a first ground pad, a balun including a primary section configured to receive the RF signal and a secondary section configured to output a differential RF signal, an amplifier configured to amplify the differential RF signal, and a first protection inductor electrically connected between the primary section and the first ground pad and operable to protect the amplifier from electrical overstress.

In another aspect, a method of electrical overstress protection in a MMIC is provided. The method includes receiving an RF signal at a signal pad, receiving the RF signal at a primary section of a balun and outputting a differential RF signal from a secondary section of the balun, amplifying the differential RF signal using an amplifier, and protecting the amplifier from electrical overstress using a first protection inductor connected between the primary section of the balun and a ground pad.

In another aspect, a semiconductor die is provided. The semiconductor die includes a plurality of pads including a signal pad configured to receive an RF signal, and a ground pad. The semiconductor die further includes a balun including a primary section configured to receive the RF signal and a secondary section configured to output a differential RF signal, a pair of field-effect transistors (FETs) configured to receive the differential RF signal, the pair of FETs including a first FET and a second FET, and a plurality of input inductors including a first input inductor electrically connected between a first end of the secondary section of the balun and a gate of the first FET, and a second input inductor electrically connected between a second end of the secondary section of the balun and a gate of the second FET.

In another aspect, a MMIC with integrated electrical overstress protection is provided. The MMIC includes an RF signal pad configured to receive the RF signal, and an RF circuit coupled to the RF signal pad and comprising a transistor layout including an input FET, and an embedded protection device connected between a gate and a source of the input FET.

BRIEF DESCRIPTION OF THE DRAWINGS

FIG. 10 is a schematic diagram of an inductor and balun layout according to one embodiment.

FIG. 16 is a graph of another example of simulation results showing a comparison of a millimeter wave amplifier implemented with and without protection inductors coupled to primary and secondary sections of a balun.

FIG. 17 is a graph of another example of simulation results showing a comparison of a millimeter wave amplifier implemented with and without gate-to-source clamps and protection inductors coupled to primary and secondary sections of a balun.

DETAILED DESCRIPTION

Figure 1:
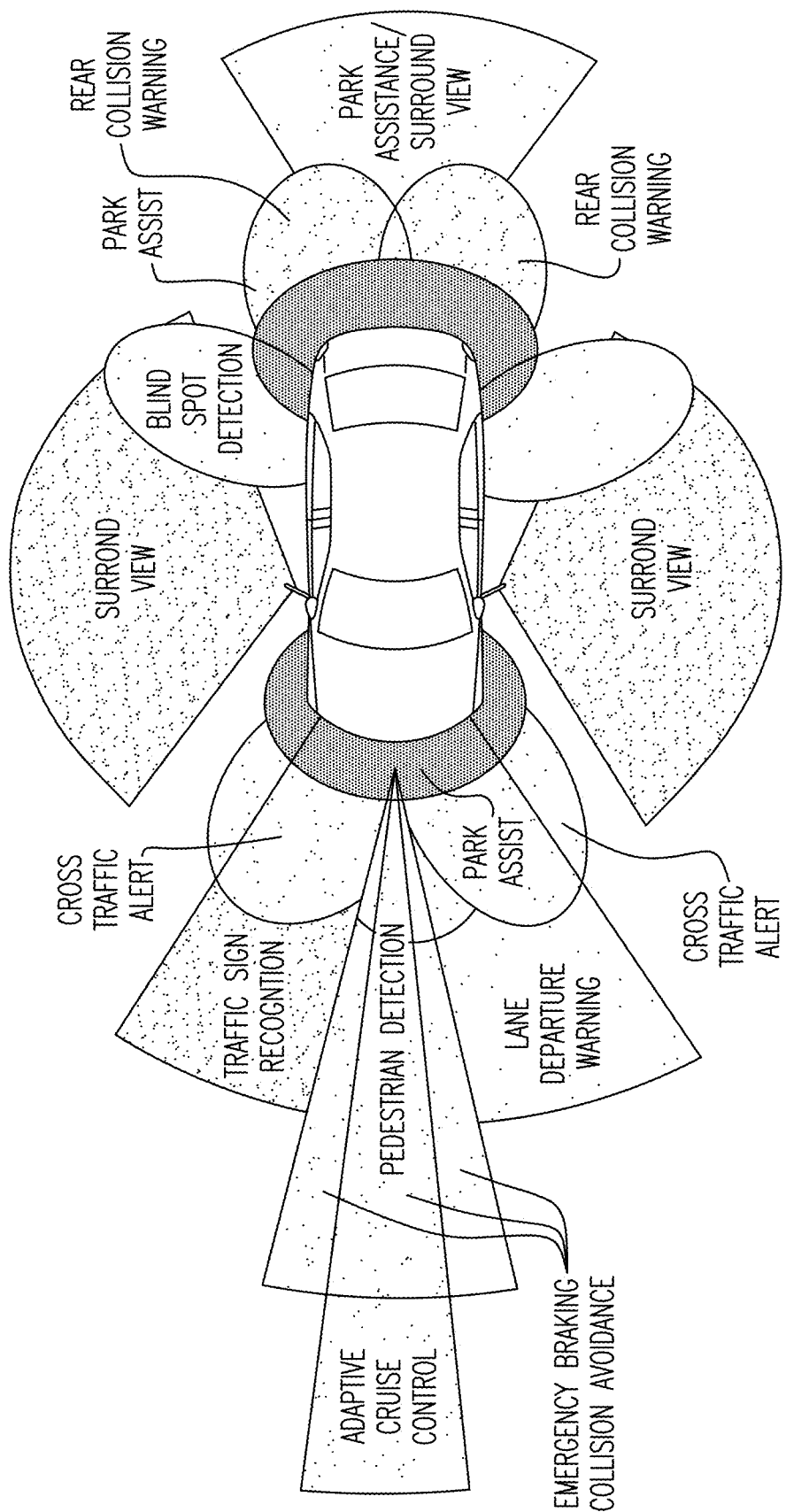
FIG. 1 is a schematic diagram of an automotive radar system according to one embodiment.

The following detailed description of embodiments presents various descriptions of specific embodiments of the invention. However, the invention can be embodied in a multitude of different ways. In this description, reference is made to the drawings where like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Certain electronic systems include overstress protection circuits to protect circuits or components from electrical overstress events. To help guarantee that an electronic system is reliable, manufacturers can test the electronic system under defined stress conditions, which can be described by standards set by various organizations, such as the Joint Electronic Device Engineering Council (JEDEC), the International Electrotechnical Commission (IEC), and the Automotive Engineering Council (AEC). The standards can cover a wide multitude of electrical overstress events, including electrical overstress (EOS) and/or electrostatic discharge (ESD).

FIG. 1 is a schematic diagram of an automotive radar system according to one embodiment. The automotive radar system of FIG. 1 illustrates one example of an application for the amplifier interfaces that are subject to electrical overstress conditions and protected by the electrical overstress protection schemes herein.

For example, the automotive radar system can include low noise amplifiers (LNAs) implemented in accordance with the teachings herein and used to amplify radio frequency (RF) signals received from antennas of the vehicle's radar system(s) and/or to amplify signals representing received light by the vehicle's lidar system(s). Example vehicular applications for LNAs include, but are not limited to, park assist, collision warning, cross traffic alert, blind spot detection, adaptive cruise control, autonomous driving, and/or emergency braking/collision avoidance.

Although FIG. 1 illustrates one example application for millimeter wave amplifiers, the teachings herein are applicable to a wide range of applications. In another example, a millimeter wave amplifier is incorporated into a phased array antenna systems, such as those used in mobile communications and/or military and defense systems.

Although certain embodiments herein are suitable for providing amplification to millimeter waves, other frequency ranges are possible. For example, the teachings herein are applicable to RF communication systems operating over a wide range of frequencies, including not only RF signals between 100 MHz and 7 GHz, but also to higher frequencies, such as those in the X band (about 7 GHz to 12 GHz), the $K_u$ band (about 12 GHz to 18 GHz), the K band (about 18 GHz to 27 GHz), the $K_a$ band (about 27 GHz to 40 GHz), the V band (about 40 GHz to 75 GHz), and/or the W band (about 75 GHz to 110 GHz). Accordingly, the teachings herein are applicable to a wide variety of RF communication systems, including microwave communication systems.

The RF signals amplified by the amplifiers can be associated with a variety of communication standards, including, but not limited to, Global System for Mobile Communications (GSM), Enhanced Data Rates for GSM Evolution (EDGE), Code Division Multiple Access (CDMA), wideband CDMA (W-CDMA), 3G, Long Term Evolution (LTE), 4G, and/or 5G, as well as other proprietary and non-proprietary communications standards.

Electrical Overstress Protection for Microwave Wave Amplifiers

Figure 2:
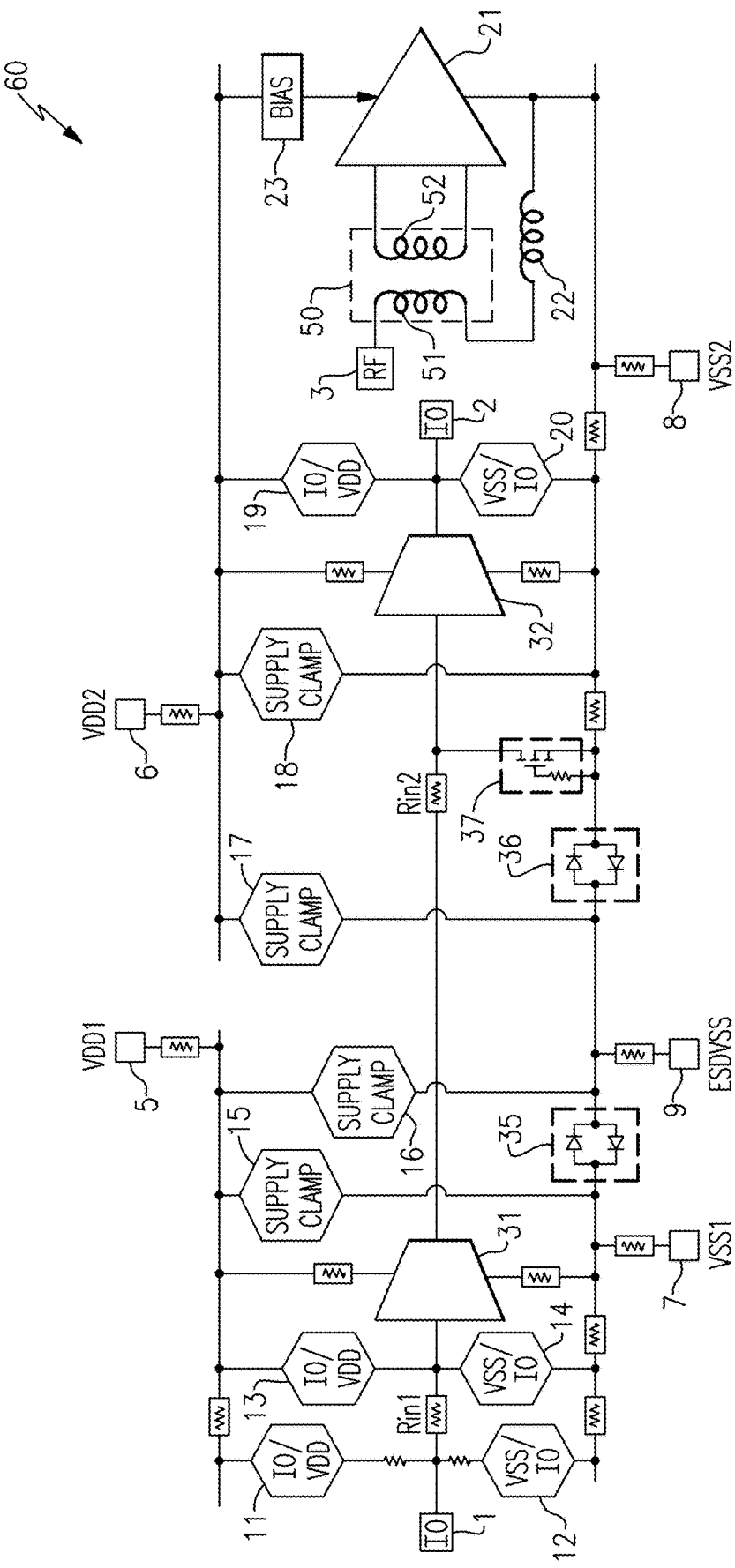
FIG. 2 is a schematic diagram of a chip interface according to one embodiment.

FIG. 2 is a schematic diagram of a chip interface 60 according to one embodiment. The chip interface 60 includes a variety of pads (also referred to herein as pins) as well as various circuits of a semiconductor die or chip. The chip interface 60 of FIG. 2 illustrates one embodiment of a chip interface that can be implemented in accordance with one or more features of the present disclosure. The chip interface 60 corresponds to an input/output (I/O) interface of a semiconductor die, such as a monolithic microwave or millimeter wave integrated circuit (MMIC).

In the illustrated embodiment, the chip interface 60 includes a variety of pins or pads, including an input signal pad 1, an output signal pad 2, an RF signal pad 3, a first power high pad 5 (VDD1) for a first power domain, a second power high pad 6 (VDD2) for a second power domain, a first power low or ground pad 7 (VSS1) for the first power domain, a second power low pad 8 (VSS2) for the second power domain, and an ESD power low pad 9 (ESDVSS). Although one example of pads is shown, a chip interface can include a wide range of types of pads, including, but not limited to, input and/or output (IO) pads, power supply pads, and/or ground pads. Although a particular number of pads is shown, more or fewer pads can be included and/or a different arrangement of pads can be used.

In the illustrated embodiment, the chip interface 60 further includes a first core circuit 31 (which can be digital, analog, or mixed signal) and a second core circuit 32 electrically connected in cascade between the input signal pad 1 and the output signal pad 2.

The chip interface 60 further includes a primary forward overstress protection circuit 11 for the input signal pad 1, a primary reverse overstress protection circuit 12 for the input signal pad 1, a secondary forward overstress protection circuit 13 for the input signal pad 1, a secondary reverse overstress protection circuit 14 for the input signal pad 1, a first supply clamp 15 between VDD1 and VSS1, a second supply clamp 16 between VDD1 and ESDVSS, a third supply clamp 17 between VDD2 and ESDVSS, a fourth supply clamp 18 between VDD2 and VSS2, a primary forward protection circuit 19 for the output signal pad 2, a primary reverse protection circuit 20 for the output signal pad 2, a microwave amplifier 21, a protection inductor 22, a bias supply block or circuit 23, a first pair of anti-parallel diodes between VSS1 to ESDVSS, a second pair of anti-parallel diodes 36 between VSS2 and ESDVSS, a gate grounded FET 37 connected between the input of the second core circuit 32 and VSS2, and a balun 50.

Furthermore, various resistors are shown, including an input resistor Rin1 to the first core circuit 131, an input resistor Rin2 to the second core circuit 32, and various resistors associated with resistances of metallization used in routing the power supplies throughout the chip interface 60.

The chip interface 60 of FIG. 2 illustrates one embodiment of a chip interface that can be implemented in accordance with one or more features of the present disclosure. Although one example of circuits for a chip interface is shown, a chip interface can include a wide range of types and/or numbers of circuits. Accordingly, other implementations are possible.

A portion of the chip interface 60 includes pads and circuitry for amplification of RF signals. For example, the chip interface 60 includes the RF signal pad 3, the ground pad 8 (VSS2, in this example), the power supply pad 6 (VDD2, in this example), the balun 50, the microwave amplifier 21, the protection inductor 22, and the bias supply block 23.

The balun 50 includes a primary section 51 that receives an RF signal from the RF signal pad 3, and a secondary section 52 that provides a differential RF signal to the microwave amplifier 21 for amplification. The primary section 51 and the secondary section 52 of the balun 50 are magnetically coupled.

As shown in FIG. 2, the bias supply block 23 receives a supply voltage from the power supply pad 6, and powers the microwave amplifier 21 with a regulated supply voltage and/or one or more controlled bias currents. The microwave amplifier 21 also receives a ground voltage from the ground pad 8.

The protection inductor 22 is electrically connected between the primary section 51 of the balun 50 and the ground pad 8, and operates to protect the microwave amplifier 21 from electrical overstress. Additionally or alternatively, the microwave amplifier 21 can be implemented with any of the protection structures disclosed herein. In certain implementations, the microwave amplifier 21 is a millimeter wave amplifier.

Figure 3:
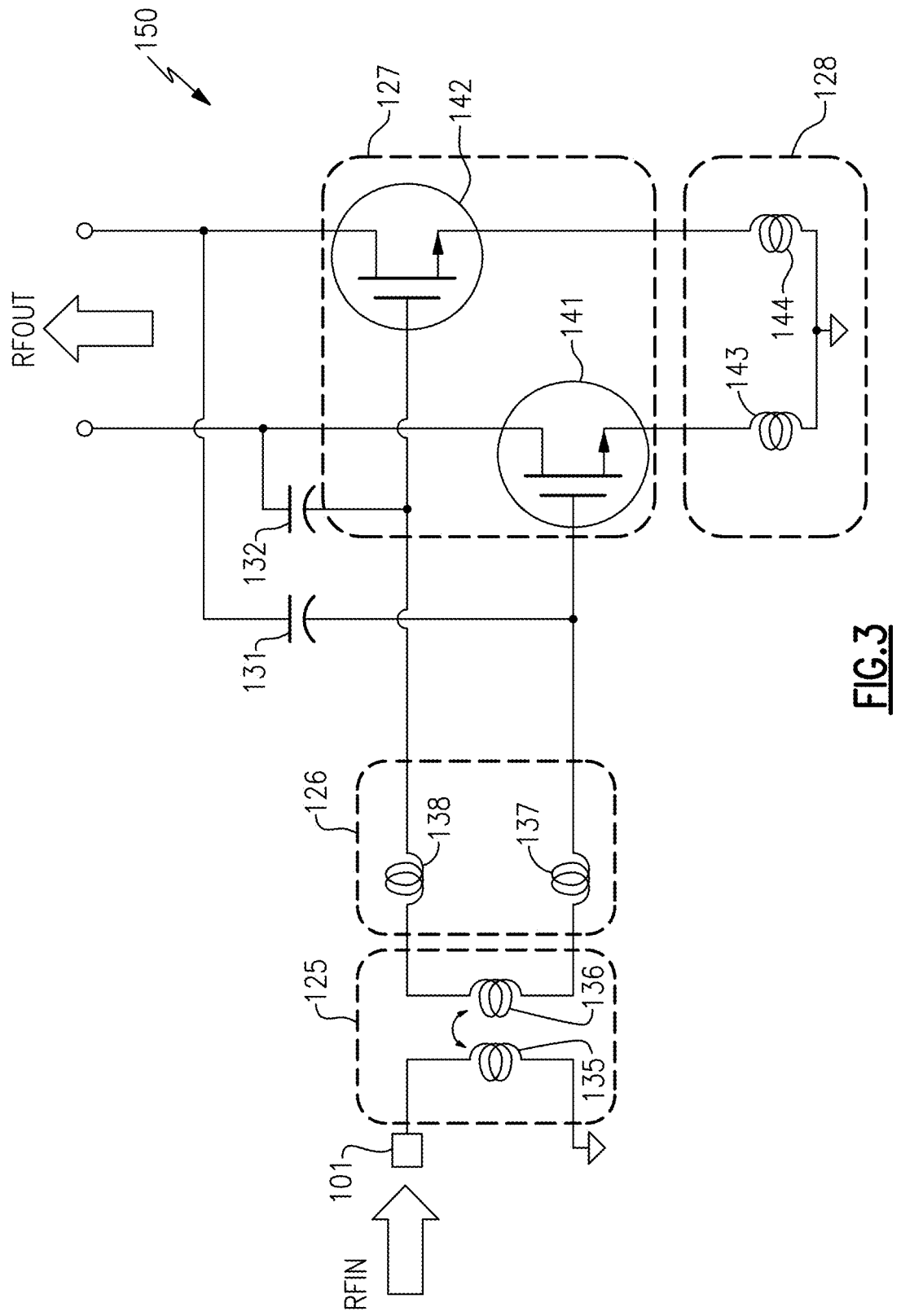
FIG. 3 is a schematic diagram of a millimeter wave amplifier according to one embodiment.

FIG. 3 is a schematic diagram of a millimeter wave amplifier 150 according to one embodiment. The millimeter wave amplifier 150 includes a balun 125, a pair of input inductors 126, amplification circuitry 127, a pair of source inductors 128, a first cross-coupled capacitor 131, and a second cross-coupled capacitor 132.

Although the millimeter wave amplifier 150 illustrates one embodiment of an amplifier implemented with protection against electrical overstress, the teachings herein are applicable to amplifiers implemented in a wide variety of ways. Furthermore, the teachings herein are also applicable to other types of RF circuits that process a differential RF signal from a balun.

As shown in FIG. 3, the balun 125 includes a primary section 135 that receives an RF signal from the RF signal pad 101. The primary section 135 is electrically connected between the RF signal pad 101 and a ground voltage provided by a ground pad (not shown in FIG. 3). The balun 125 further includes a secondary section 136 that outputs a differential RF signal that is provided to the amplification circuitry 127 by way of the pair of input inductors 126.

In the illustrated embodiment, the amplification circuitry 127 includes a first amplification field-effect transistor (FET) 141 and a second amplification FET 142. Additionally, the input inductors 126 include a first input inductor 137 and a second input inductor 138. As shown in FIG. 3, a gate of the first amplification FET 141 is electrically connected to a first end of the secondary section 136 of the balun 125 by way of the first input inductor 137, while a gate of the second amplification FET 142 is electrically connected to a second end of the secondary section 136 of the balun 125 by way of the second input inductor 138.

Including the first input inductor 137 and the second input inductor 138 aids in protecting the first amplification FET 141 and the second amplification FET 142 from damage. For example, the first input inductor 137 and the second input inductor 138 can serve to block or impede high frequency currents from reaching the gates of the FETs and causing voltage build-up.

The first amplification FET 141 and the second amplification FET 142 can be implemented in a wide variety of ways, such as using metal-oxide-semiconductor transistors (MOS), FinFET transistors, and/or compound semiconductor transistors, such as high electron mobility transistors (HEMTs). Thus, the teachings herein are applicable to a wide range of processing technologies, including, but not limited to silicon processes (for instance, silicon-on-insulator or SOI) and compound semiconductor processes (for instance, gallium nitride or GaN). Although an example with n-type transistors is shown, the teachings herein are also applicable to amplifiers with p-type transistors or a combination of p-type and n-type transistors. Furthermore, although an example with FETs is shown, the teachings herein are also applicable to amplifiers implemented with bipolar transistors or a combination of FETs and bipolar transistors. Moreover, the teachings herein are also applicable to other types of RF circuits that process a differential RF signal from a balun.

The first amplification FET 141 and the second amplification FET 142 can have any suitable geometry, such as minimum channel length for the technology (to provide enhanced performance at microwave frequencies) and a width selected based on noise figure (NF) constraints. The FET layouts can include multi-finger devices electrically connected to one another using metallization. In one example, each amplification FET includes 64 fingers of 320 nm width to achieve a total device the width of 18 μm. However, other implementations are possible.

As shown in FIG. 3, the pair of source inductors 128 include a first source inductor 143 electrically connected between a source of the first amplification FET 141 and a ground voltage, and a second source inductor 144 electrically connected between a source of the second amplification FET 142 and the ground voltage.

The ground voltage for the sources of the first amplification FET 141 and the second amplification FET 142 can be the same or different as the ground voltage of the primary section 135 of the balun 125.

In one example, a common ground pad provides a ground voltage to the primary section 135 of the balun 125 and to the sources of the first amplification FET 141 and the second amplification FET 142.

In a second example, a first ground pad provides a first ground voltage to the primary section 135 of the balun 125, while a second ground pad provides a second ground voltage to the sources of the first amplification FET 141 and the second amplification FET 142. In certain implementations, the first ground pad and the second ground pad are connected on-chip using a decoupling circuit, such as decoupling inductor and/or anti-parallel diodes. Thus, the teachings herein are applicable to chip interfaces including multiple ground domains that are coupled on chip or off chip to achieve a desired amount of isolation.

The first cross-coupled capacitor 131 is electrically connected between a gate of the first amplification FET 141 and a drain of the second amplification FET 142. Additionally, the second cross-coupled capacitor 132 is electrically connected between a gate of the second amplification FET 142 and a drain of the first amplification FET 141. In certain implementations, the cross-coupled capacitors are implemented as metal-oxide-metal (MOM) capacitors. The cross-coupled capacitors can have any suitable capacitance, such as a capacitance in the range of 5 fF to 25 fF.

The millimeter wave amplifier 150 provides a differential RF signal between the drains of the first amplification FET 141 and the second amplification FET 142, in this example. In certain implementations, power is also provided to millimeter wave amplifier 150 by way of the drains of the first amplification FET 141 and the second amplification FET 142. For example, the millimeter wave amplifier 150 can further include a first choke inductor electrically connected between the drain of the first amplification FET 141 and a regulated supply voltage from a bias supply block, and a second choke inductor electrically connected between the drain of the second amplification FET 142 and the regulated supply voltage.

Figure 4:
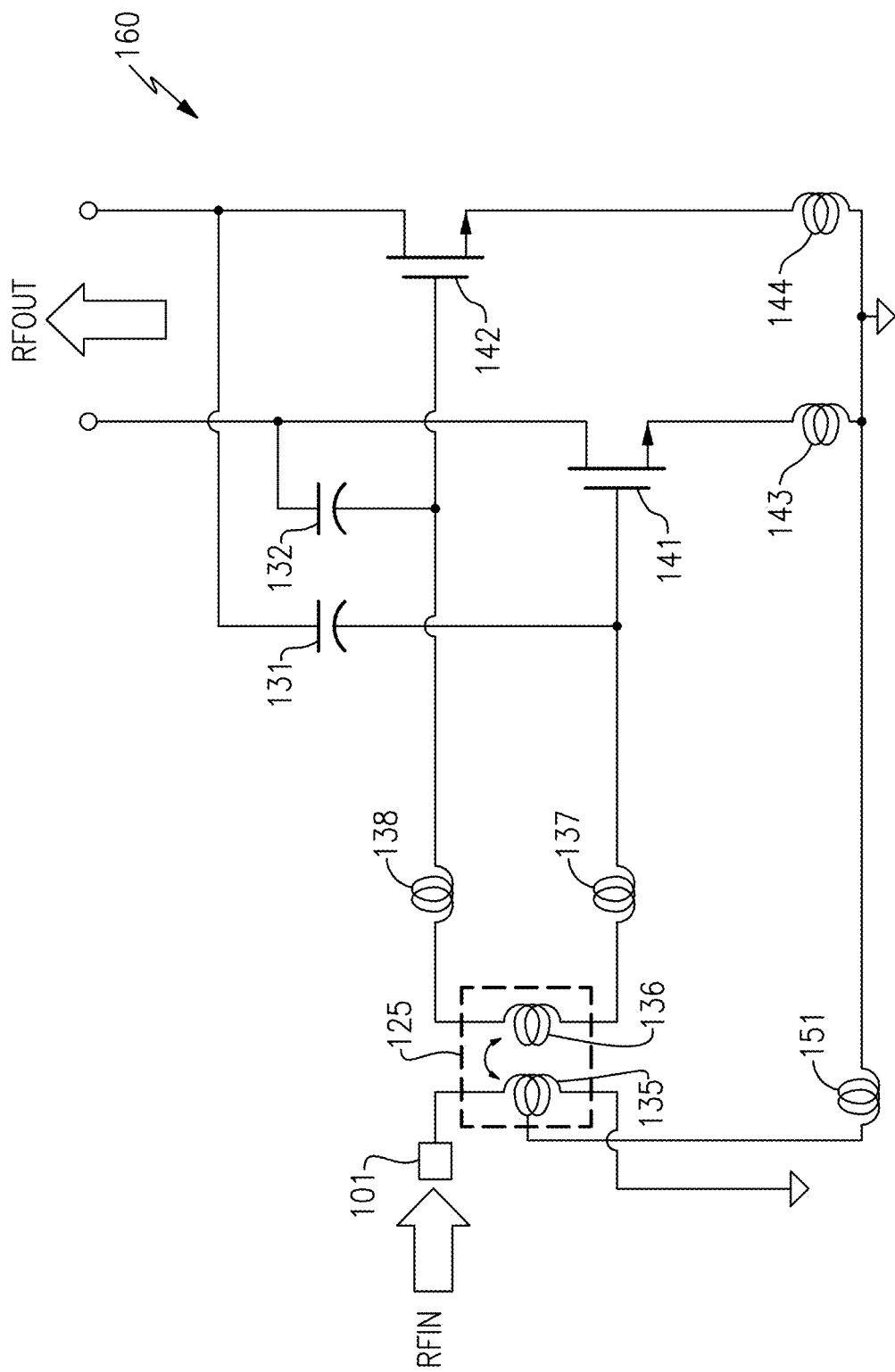
FIG. 4 is a schematic diagram of a millimeter wave amplifier according to another embodiment.

FIG. 4 is a schematic diagram of a millimeter wave amplifier 160 according to another embodiment. The millimeter wave amplifier 160 includes a balun 125, a first cross-coupled capacitor 131, a second cross-coupled capacitor 132, a first input inductor 137, a second input inductor 138, a first amplification FET 141, a second amplification FET 142, a first source inductor 143, a second source inductor 144, and a protection inductor 151 (also referred to herein as a first protection inductor or inductor L1).

The millimeter wave amplifier 160 of FIG. 4 is similar to the millimeter wave amplifier 150 of FIG. 3, except that the millimeter wave amplifier 160 further includes the protection inductor 151.

Including the protection inductor 151 aids in protecting against electrical overstress events at the RF signal pad 101. Such electrical overstress events include not only ESD events, but other types of overstress, such as field-induced charged-device model (FICDM) events. For example, the protection inductor 151 operates as a shunt inductor to the primary section 135 of the balun 125, and serves to reduce overstress stress during short duration overstress events.

In certain implementations, the protection inductor 151 is electrically connected to a center tap of the primary section 135 of the balun 125.

The protection inductor 151 can have any suitable inductance, for instance, an inductance of at least 150 pH. In certain implementations, the protection inductor 151 has a maximum inductance selected based on ESD event performance at 10 GHz.

Figure 5:
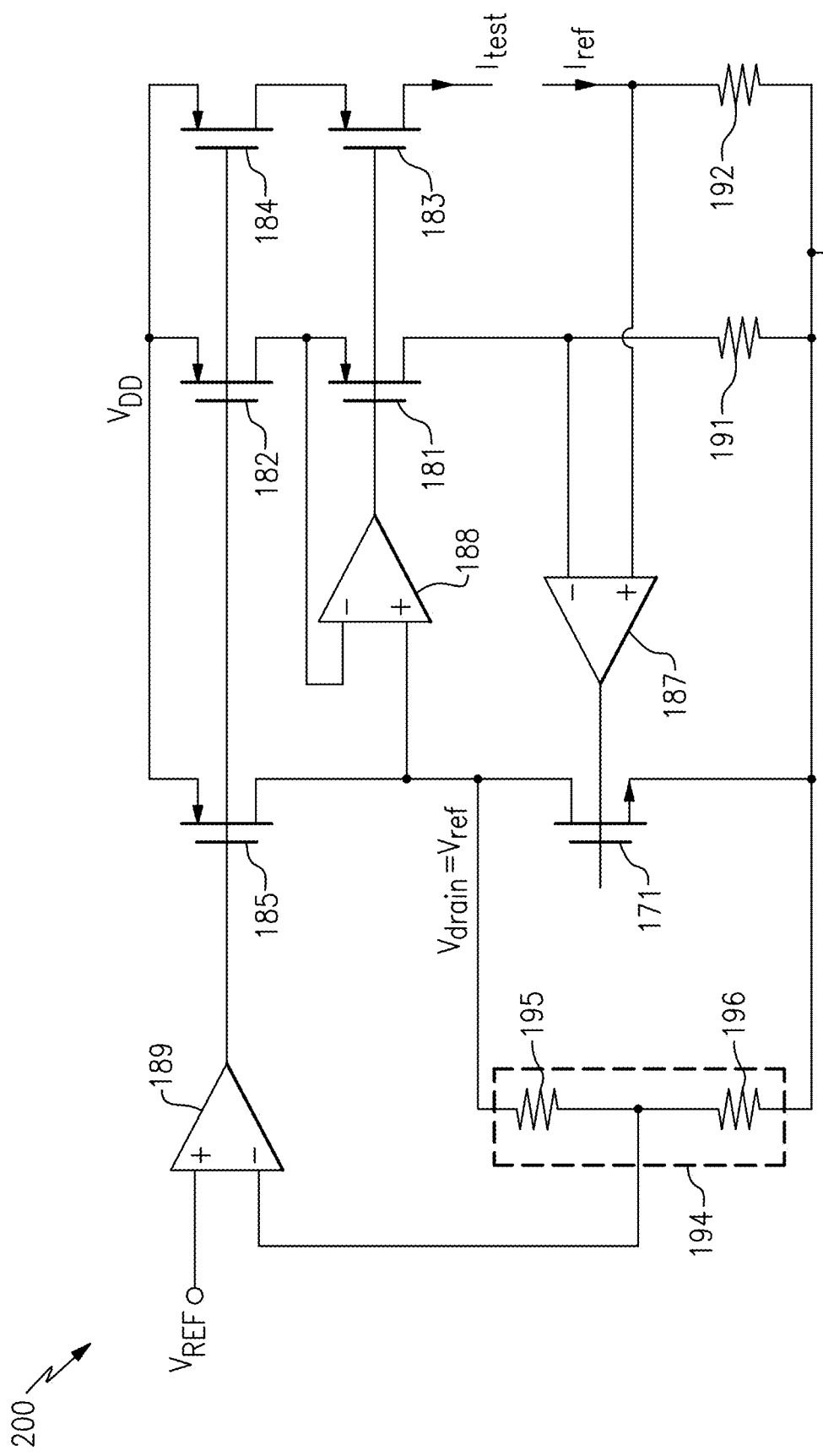
FIG. 5 is a schematic diagram of one embodiment of a bias supply block for a millimeter wave amplifier.

FIG. 5 is a schematic diagram of one embodiment of a bias supply block 200 for a millimeter wave amplifier. For example, the bias supply block 200 illustrates one embodiment of the bias supply block 23 of FIG. 2. Although FIG. 5 illustrates one embodiment of a bias supply block, the teachings herein are applicable to bias supply blocks implemented in other ways.

In the illustrated embodiment, the bias supply block 200 includes a first p-type field effect transistor (PFET) 181, a second PFET 182, a third PFET 183, a fourth PFET 184, a fifth PFET 185, a first amplifier 187, a second amplifier 188, a third amplifier 189, a first biasing resistor 191, a second biasing resistor 192, and a voltage divider 194 that includes a first voltage divider resistor 195 and a second voltage divider resistor 196.

In FIG. 5, the millimeter wave amplifier is represented as a transconductance gain element, depicted schematically as an n-type field effect transistor (NFET) 171. However, the millimeter wave amplifier can be implemented in any suitable way. Although one embodiment of a bias supply block is depicted, a millimeter wave amplifier can receive power in a wide variety of ways.

In the illustrated embodiment, the bias supply block 200 receives a supply voltage $V_{DD}$ (for instance, 0.9 V) from a power supply pad (not shown in FIG. 5). The bias supply block 200 also receives a reference voltage $V_{REF}$ (for instance, 0.7 V), which can be a bandgap voltage. Furthermore, the bias supply block 200 further also receives a reference current $I_{ref}$. The reference voltage $V_{REF}$ and the reference current $I_{ref}$ can be generated on chip, off chip, or a combination thereof.

As shown in FIG. 5, the bias supply block 200 includes a first control loop that sets regulated supply voltage (corresponding to $V_{drain}$, in this example) substantially equal to the reference voltage $V_{REF}$. Additionally, the bias supply block 200 includes a second control loop operable to control a current through the transconductance gain element 171 substantially equal the reference current ($I_{ref}$). When used to bias a millimeter wave amplifier, the bias supply block 200 tightly controls the supply voltage and current of the millimeter wave amplifier (represented schematically as NFET 171).

In some embodiments, the NFET 171 corresponds to one of the first amplification FET 141 or the second amplifier FET 142 of FIGS. 3, 4 and 6-9D. In certain embodiments, the depicted circuitry of the supply bias block 200 is replicated to provide regulated voltages and controlled bias currents for each transistor of an input transistor pair of a differential millimeter wave amplifier. For example, a first instantiation of the depicted circuitry can be used to bias the first amplification FET 141 of FIGS. 3, 4, and 6-9D (with the first instantiation of the NFET 171 corresponding to the first amplification FET 141), while a second instantiation of the depicted circuitry can be used to bias the second amplification FET 142 of FIGS. 3, 4, and 6-9D (with the second instantiation of the NFET 171 corresponding to the second amplification FET 142).

In the illustrated embodiment, the supply bias block 200 also generates a test current $I_{test}$, which can be processed to verify the accuracy of the depicted bias current control loop.

Figure 6:
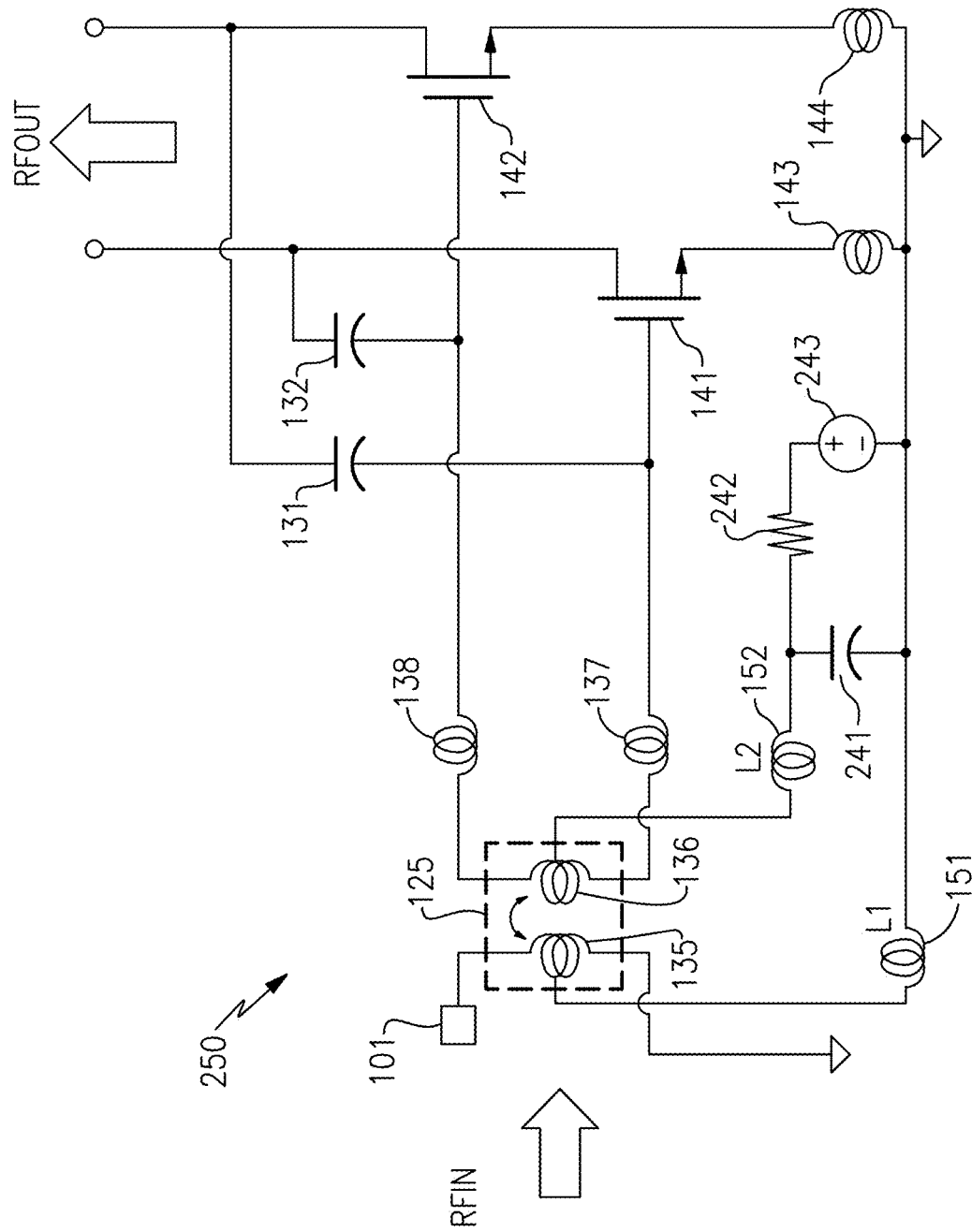
FIG. 6 is a schematic diagram of a millimeter wave amplifier according to another embodiment.

FIG. 6 is a schematic diagram of a millimeter wave amplifier 250 according to another embodiment. The millimeter wave amplifier 250 includes a balun 125, a first cross-coupled capacitor 131, a second cross-coupled capacitor 132, a first input inductor 137, a second input inductor 138, a first amplification FET 141, a second amplification FET 142, a first source inductor 143, a second source inductor 144, a first protection inductor 151 (also referred to herein as inductor L1), a second protection inductor 152 (also referred to herein as inductor L2), a capacitor 241, a resistor 242, and a voltage source 243.

The millimeter wave amplifier 250 of FIG. 6 is similar to the millimeter wave amplifier 160 of FIG. 4, except that the millimeter wave amplifier 250 further includes the second protection inductor 152, the capacitor 241, the resistor 242, and the voltage source 243.

As shown in FIG. 6, the second protection inductor 152 is electrically connected to the secondary section 136 of the balun 125. In certain implementations, the second protection inductor 152 is connected to a center tap of the secondary section 136. The second protection inductor 152 can have any suitable inductance value, for instance, an inductance of at least 150 pH.

The second protection inductor 152 is electrically connected in series with the capacitor 241 between the secondary section 136 of the balun 125 and a ground voltage from a ground pad.

In certain implementations, the first protection inductor 151 and/or the second protection inductor 152 are connectable to the balun 125 by way of a metallization option. Thus, the first protection inductor 151 and/or the second protection inductor 152 can be programmable via metal to provide extra clamping as desired.

As shown in FIG. 6, the voltage source 242 is electrically connected in parallel with the capacitor 241 and is operable to control a DC input voltage to the first amplification FET 141 and second amplification FET 142. In certain implementations, the voltage level of the voltage source 242 is controlled by a control loop of a supply control block, thereby providing control over a bias current through the amplifier 250.

Figure 7:
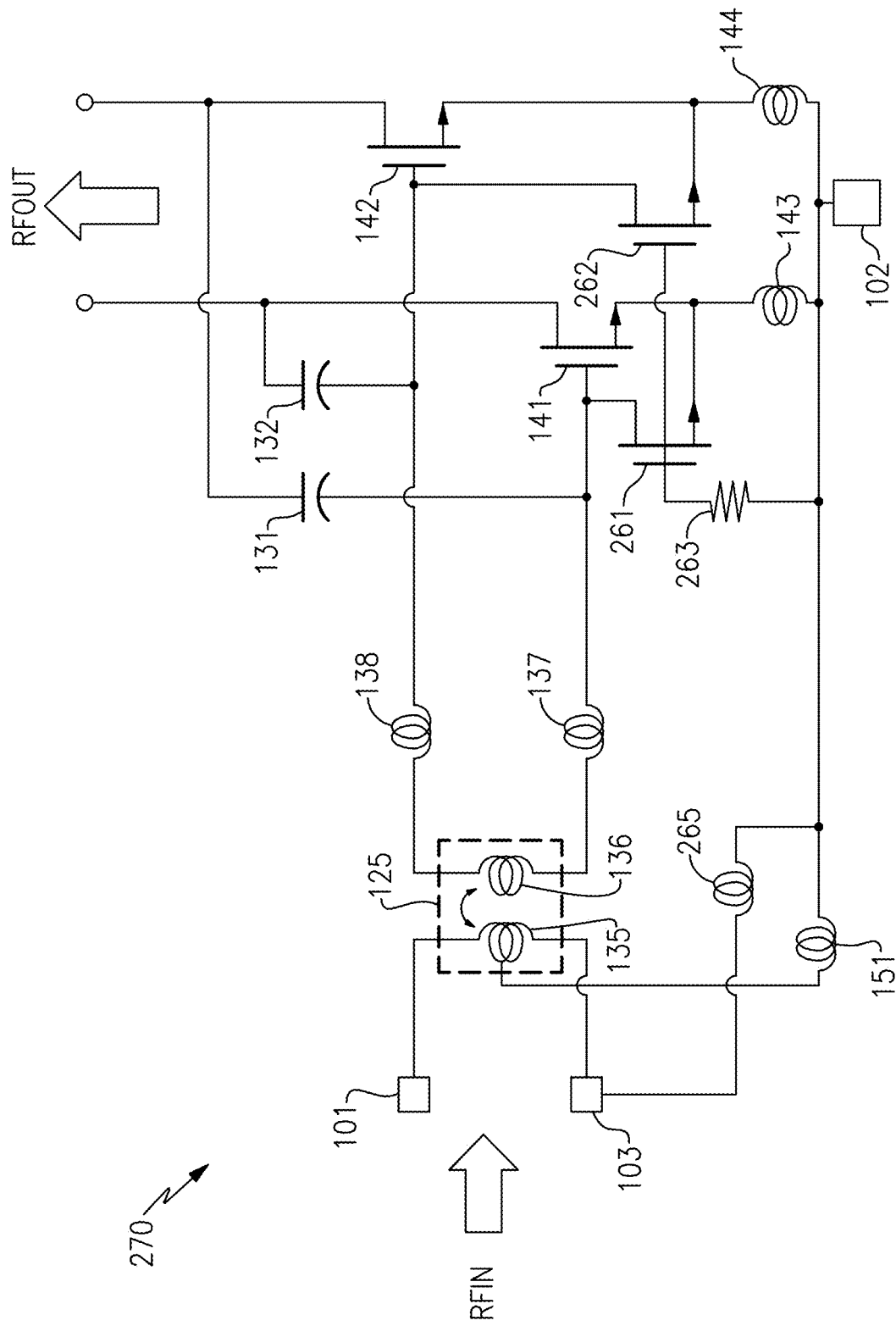
FIG. 7 is a schematic diagram of a millimeter wave amplifier according to another embodiment.

FIG. 7 is a schematic diagram of a millimeter wave amplifier 270 according to another embodiment. The millimeter wave amplifier 270 includes a balun 125, a first cross-coupled capacitor 131, a second cross-coupled capacitor 132, a first input inductor 137, a second input inductor 138, a first amplification FET 141, a second amplification FET 142, a first source inductor 143, a second source inductor 144, a protection inductor 151, a first clamping FET 261, a second clamping FET 262, a common gate resistor 263, and a decoupling inductor 265.

The millimeter wave amplifier 270 of FIG. 7 is similar to the millimeter wave amplifier 160 of FIG. 4, except that the millimeter wave amplifier 270 further includes the first clamping FET 261, the second clamping FET 262, the common gate resistor 263, and the decoupling inductor 265. Additionally, the illustrated embodiment operates using multiple ground domains (associated with a first ground pad 102 and a second ground pad 103, in this example) that are decoupled from one another using a decoupling circuit (corresponding to the decoupling inductor 265, in this example).

The first clamping FET 261 is electrically connected across the gate and source of the first amplification FET 141, while the second clamping FET 262 is electrically connected across the gate and source of the second amplification FET 142. Additionally, the common resistor 263 includes a first end electrically connected to the first ground pad 102 and a second end electrically connected to a gate of the first clamping FET 261 and to a gate of the second clamping FET 262. However, other implementations are possible. For example, low noise amplifier configurations can include different numbers of FETs directly connected to the interface, in which case the same concept can be applied.

The first clamping FET 261 and second clamping FET 262 serve as off-FET (for instance, off-NMOS) embedded protection for the amplification FETs of the millimeter wave amplifier 270. For instance, the clamping FETs can serve to provide self-FICDM protection.

In certain implementations, an amplification FET and corresponding clamping FET are implemented using a shared multi-finger layout. For example, a first portion of the fingers of the layout can be used to implement the amplification FET (for instance, the first amplification FET 141) while a second portion of the fingers of the layout can be used to implement the clamping FET (for instance, the first clamping FET 261).

In another embodiment, the input active device can be implemented for high power high frequency microwave and millimeter wave applications using GaAs or GaN HEMT devices, as these type of technology provide advantage in high frequency operation and noise performance. In such implementations, the gate terminal operates as a forward Schottky diode in one direction or applied voltage polarity, while in the opposite direction is sensitive to negative-overstress induced damage. To address this limitation, the implementation described above (which can correspond, for example, to an implementation in a Silicon process such as a CMOS process) is implemented for the case of GaAs and/or GaN high electron mobility transistor (HEMT) devices, for instance, the cross-sections of FIG. 19 or 20.

Figure 8:
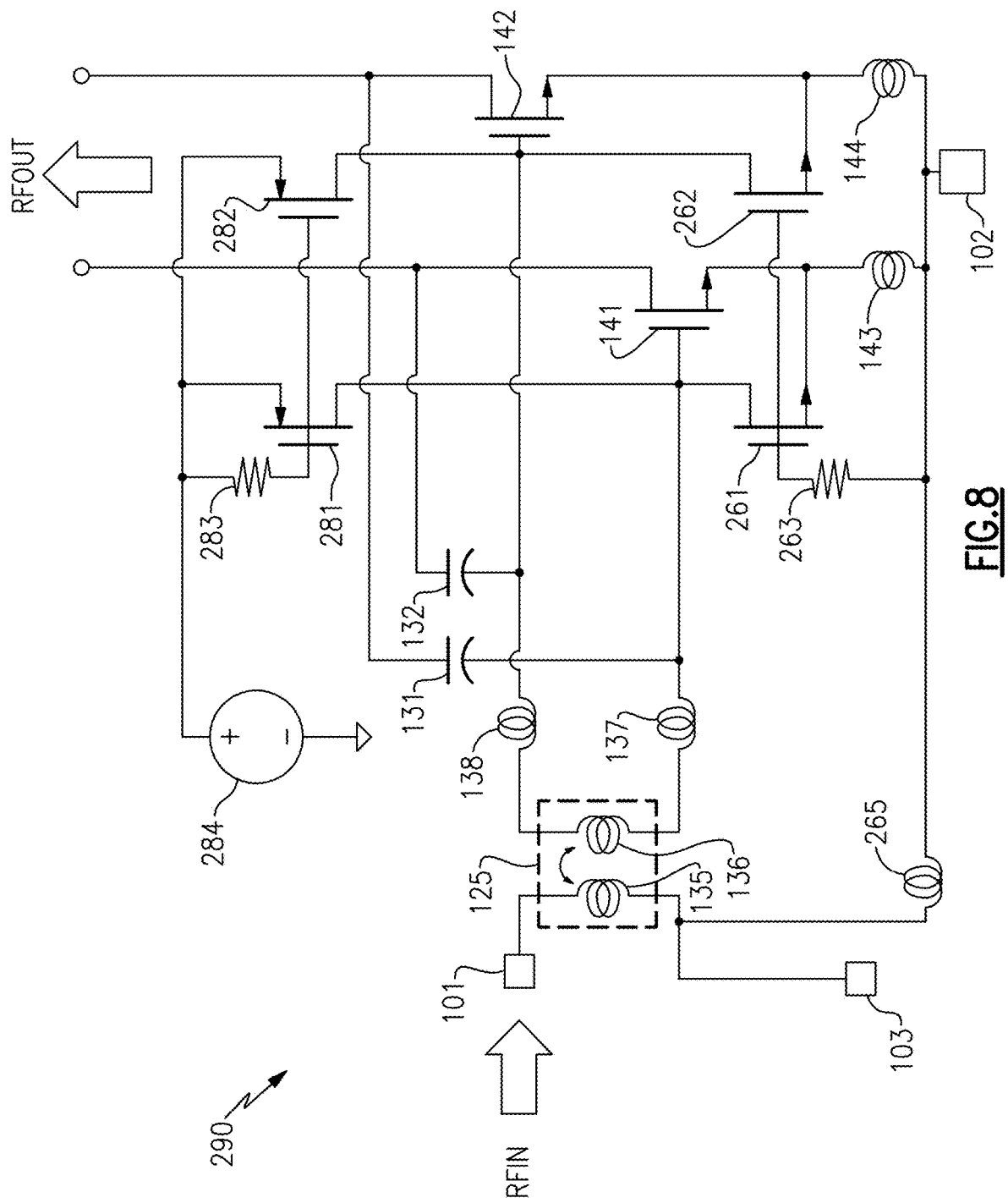
FIG. 8 is a schematic diagram of a millimeter wave amplifier according to another embodiment.

FIG. 8 is a schematic diagram of a millimeter wave amplifier 290 according to another embodiment. The millimeter wave amplifier 290 includes a balun 125, a first cross-coupled capacitor 131, a second cross-coupled capacitor 132, a first input inductor 137, a second input inductor 138, a first amplification FET 141, a second amplification FET 142, a first source inductor 143, a second source inductor 144, a first clamping FET 261, a second clamping FET 262, a first common gate resistor 263, a decoupling inductor 265, a third clamping FET 281, a fourth clamping FET 282, a second common gate resistor 283, and a voltage source 284.

The millimeter wave amplifier 290 of FIG. 8 is similar to the millimeter wave amplifier 270 of FIG. 7, except that the millimeter wave amplifier 290 omits the protection inductor 151 and further includes the third clamping FET 281, the fourth clamping FET 282, the second common gate resistor 283, and the voltage source 284.

In the illustrated embodiment, the third clamping FET 281 is electrically connected between the gate of the first amplification FET 141 and a clamping node, and the fourth clamping FET 282 is electrically connected between the gate of the second amplification FET 142 and the clamping node. The clamping node is connected to the voltage source 284, in this example. Additionally, the second common resistor 283 includes a first end electrically connected to the clamping node and a second end electrically connected to a gate of the third clamping FET 281 and to the gate of the fourth clamping FET 282.

As shown in FIG. 8, the first and second clamping FETs 261, 262 have a first device polarity (n-type, in this example), while the third and fourth clamping FETs 281, 282 have a second device polarity (p-type, in this example). For example, the clamping FETs can be implemented as a first pair of NMOS off clamps and a second pair of PMOS off clamps.

Figure 9A:
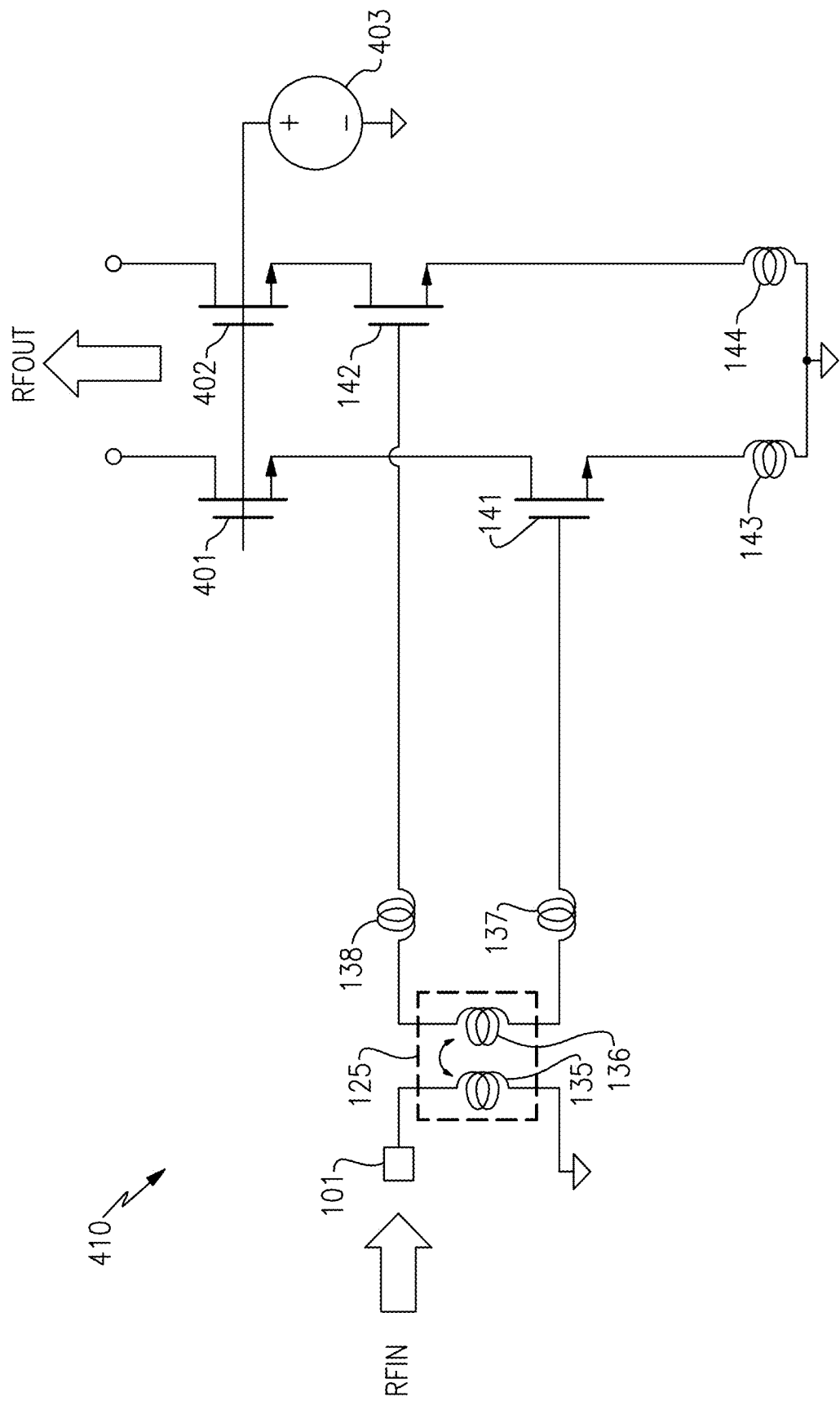
FIG. 9A is a schematic diagram of a millimeter wave amplifier according to another embodiment.

FIG. 9A is a schematic diagram of a millimeter wave amplifier 410 according to another embodiment. The millimeter wave amplifier 410 includes a balun 125, a first input inductor 137, a second input inductor 138, a first amplification FET 141, a second amplification FET 142, a first source inductor 143, a second source inductor 144, a first cascode FET 401, a second cascode FET 402, and a cascode bias voltage source 403.

The teachings herein are applicable to a wide variety of types of amplifiers, including, but not limited to, common-source amplifiers, common-emitter amplifiers, FET cascode amplifiers, and/or bipolar cascode amplifiers. Although depicted with one pair of cascode transistors, additional pairs of cascode transistors can be included.

Figure 9B:
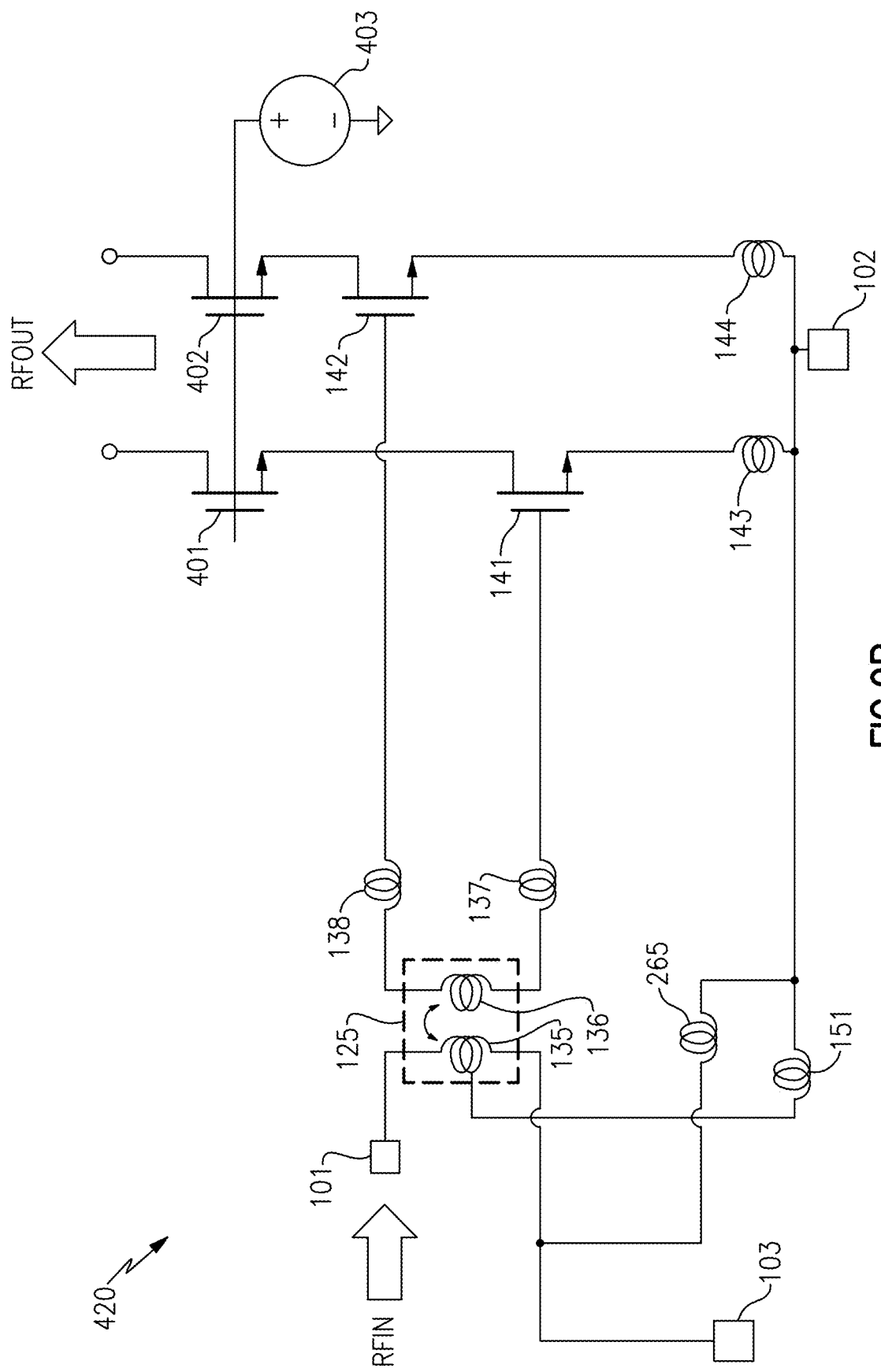
FIG. 9B is a schematic diagram of a millimeter wave amplifier according to another embodiment.

FIG. 9B is a schematic diagram of a millimeter wave amplifier 420 according to another embodiment. The millimeter wave amplifier 420 includes a balun 125, a first input inductor 137, a second input inductor 138, a first amplification FET 141, a second amplification FET 142, a first source inductor 143, a second source inductor 144, a first cascode FET 401, a second cascode FET 402, a cascode bias voltage source 403, a protection inductor 151, and a decoupling inductor 265.

The millimeter wave amplifier 420 of FIG. 9B is similar to the millimeter wave amplifier 410 of FIG. 9A, except that the millimeter wave amplifier 420 further includes the protection inductor 151 and the decoupling inductor 265.

Figure 9C:
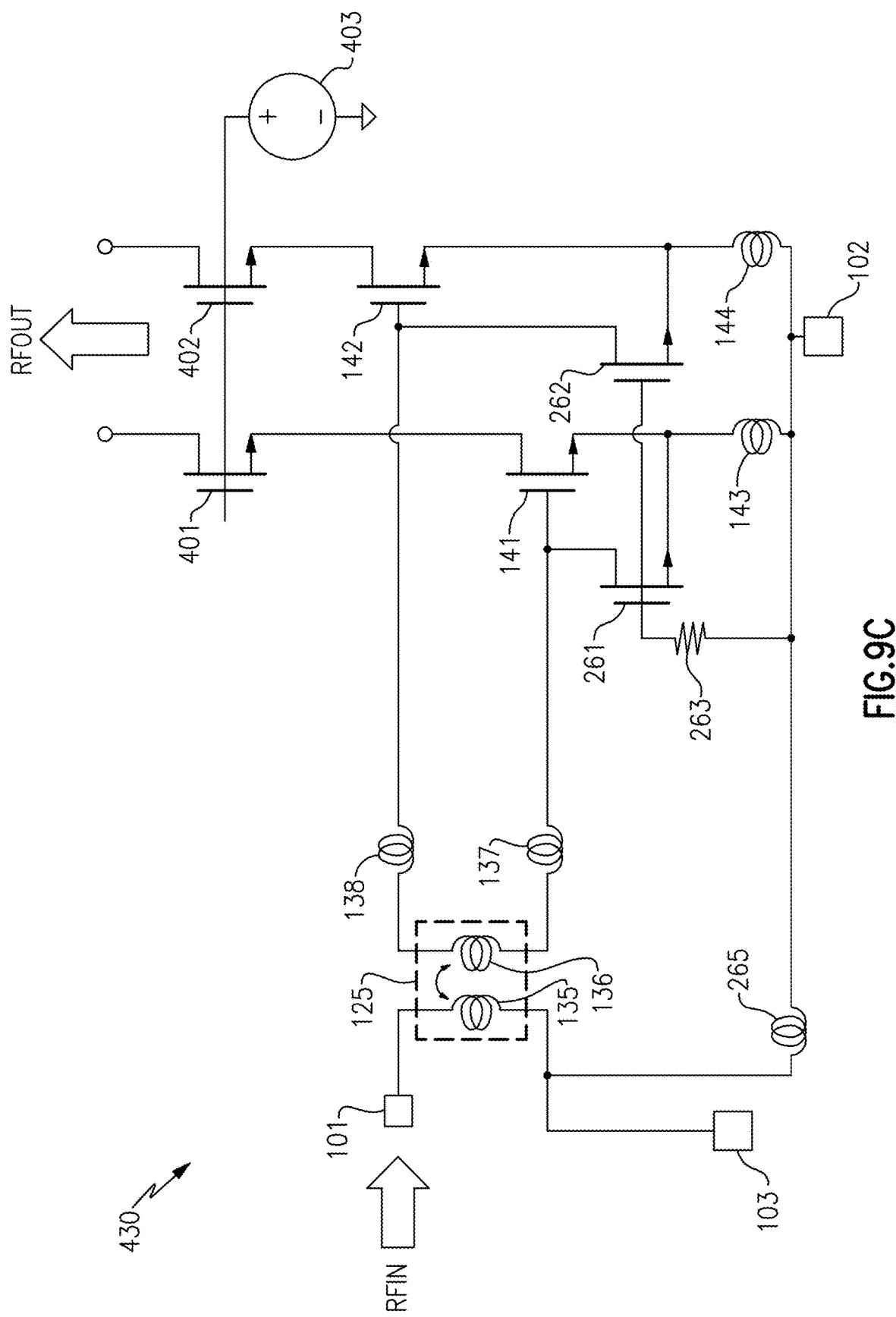
FIG. 9C is a schematic diagram of a millimeter wave amplifier according to another embodiment.

FIG. 9C is a schematic diagram of a millimeter wave amplifier 430 according to another embodiment. The millimeter wave amplifier 430 includes a balun 125, a first input inductor 137, a second input inductor 138, a first amplification FET 141, a second amplification FET 142, a first source inductor 143, a second source inductor 144, a first cascode FET 401, a second cascode FET 402, a cascode bias voltage source 403, a decoupling inductor 265, a first clamping FET 261, a second clamping FET 262, and a common gate resistor 263.

The millimeter wave amplifier 430 of FIG. 9C is similar to the millimeter wave amplifier 420 of FIG. 9B, except that the millimeter wave amplifier 430 omits the protection inductor 151 and further includes the first clamping FET 261, the second clamping FET 262, and the common gate resistor 263.

Figure 9D:
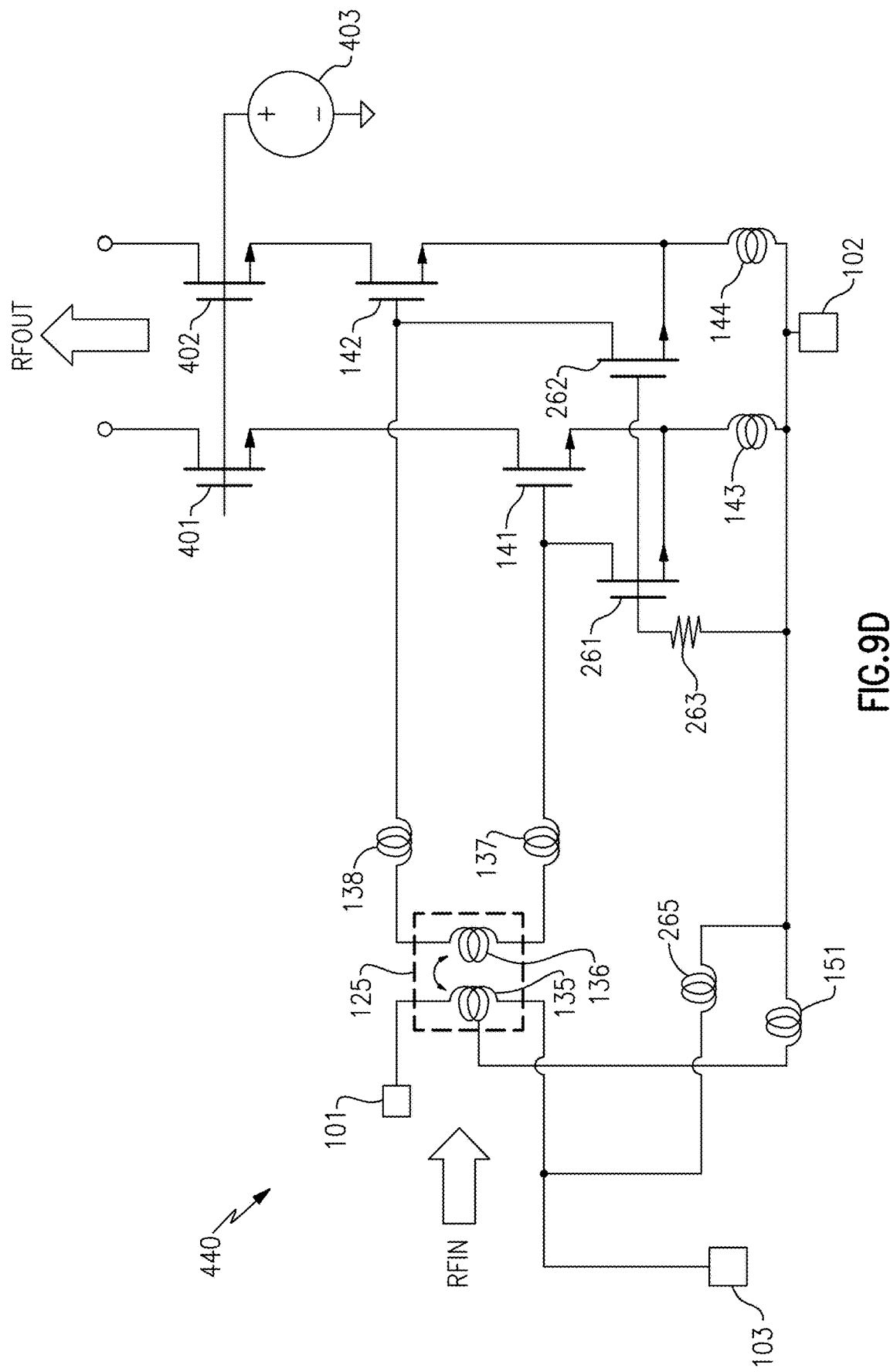
FIG. 9D is a schematic diagram of a millimeter wave amplifier according to another embodiment.

FIG. 9D is a schematic diagram of a millimeter wave amplifier 440 according to another embodiment. The millimeter wave amplifier 440 includes a balun 125, a first input inductor 137, a second input inductor 138, a first amplification FET 141, a second amplification FET 142, a first source inductor 143, a second source inductor 144, a first cascode FET 401, a second cascode FET 402, a cascode bias voltage source 403, a decoupling inductor 265, a first clamping FET 261, a second clamping FET 262, a common gate resistor 263, and a protection inductor 151.

The millimeter wave amplifier 440 of FIG. 9D is similar to the millimeter wave amplifier 430 of FIG. 9C, except that the millimeter wave amplifier 440 further includes the protection inductor 151.

FIG. 10 is a schematic diagram of an inductor and balun layout according to one embodiment. The inductor and balun layout includes a balun 531, a pair of source inductors 532 for input transistors located at position 534, and a pair of input inductors 533 for protecting the gates of the pair of input transistors at position 534. Although one embodiment of a metallization layout is depicted, the teachings herein are applicable to baluns and inductors implemented in a wide variety of ways.

Figure 11:
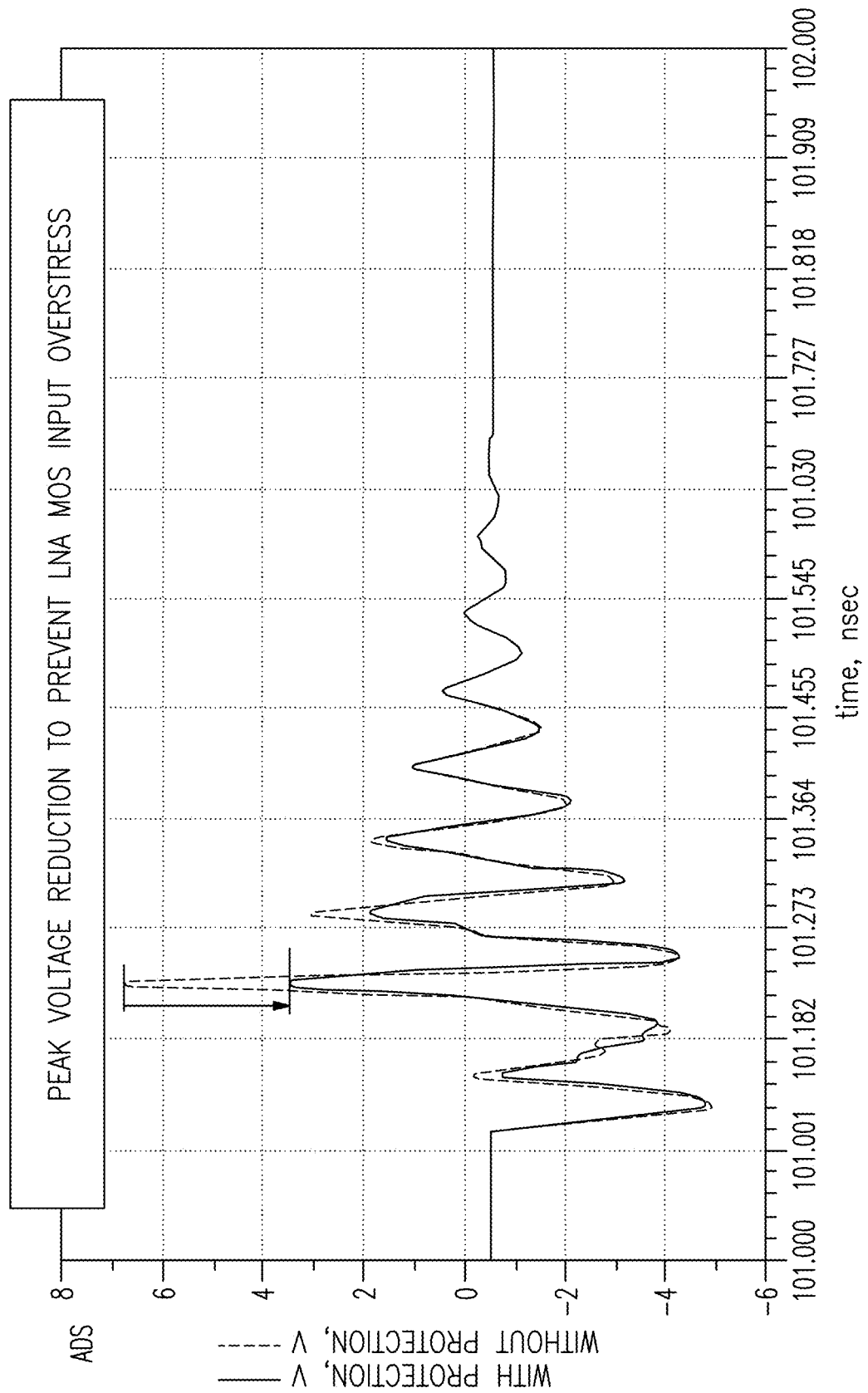
FIG. 11 is a graph of one example of simulation results showing a comparison of a millimeter wave amplifier implemented with and without gate-to-source clamps.

FIG. 11 is a graph of one example of simulation results showing a comparison of a millimeter wave amplifier implemented with and without gate-to-source clamps. The graphs depict input transistor gate voltage versus time for the two scenarios.

Figure 12:
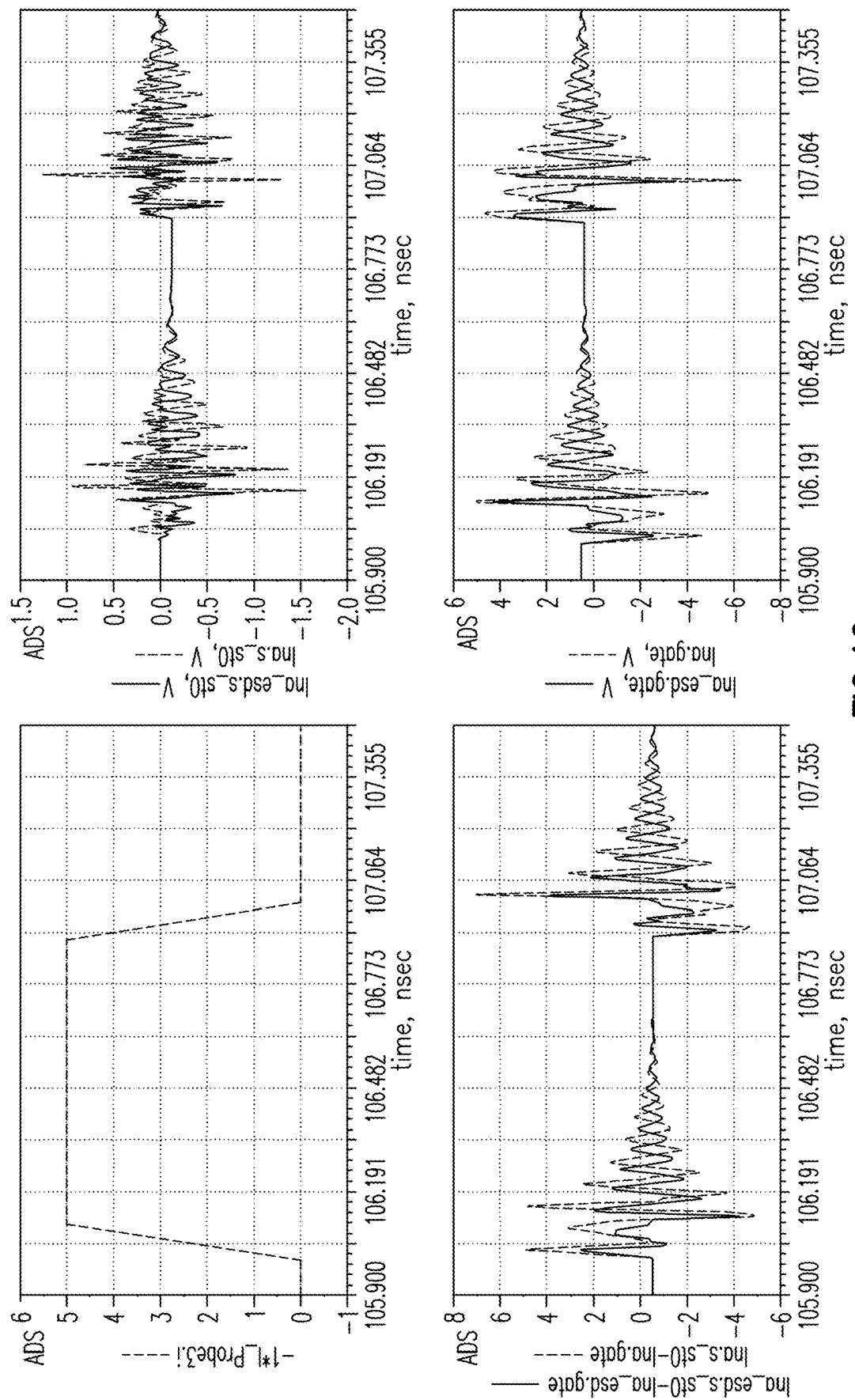
FIG. 12 is a graph of one example of simulation results showing a comparison of a millimeter wave amplifier implemented with and without a protection inductor coupled to a primary section of a balun.

FIG. 12 is a graph of one example of simulation results showing a comparison of a millimeter wave amplifier implemented with and without a protection inductor coupled to a primary section of a balun. As shown in FIG. 12, the simulated stress event is 5 Amps.

Figure 13:
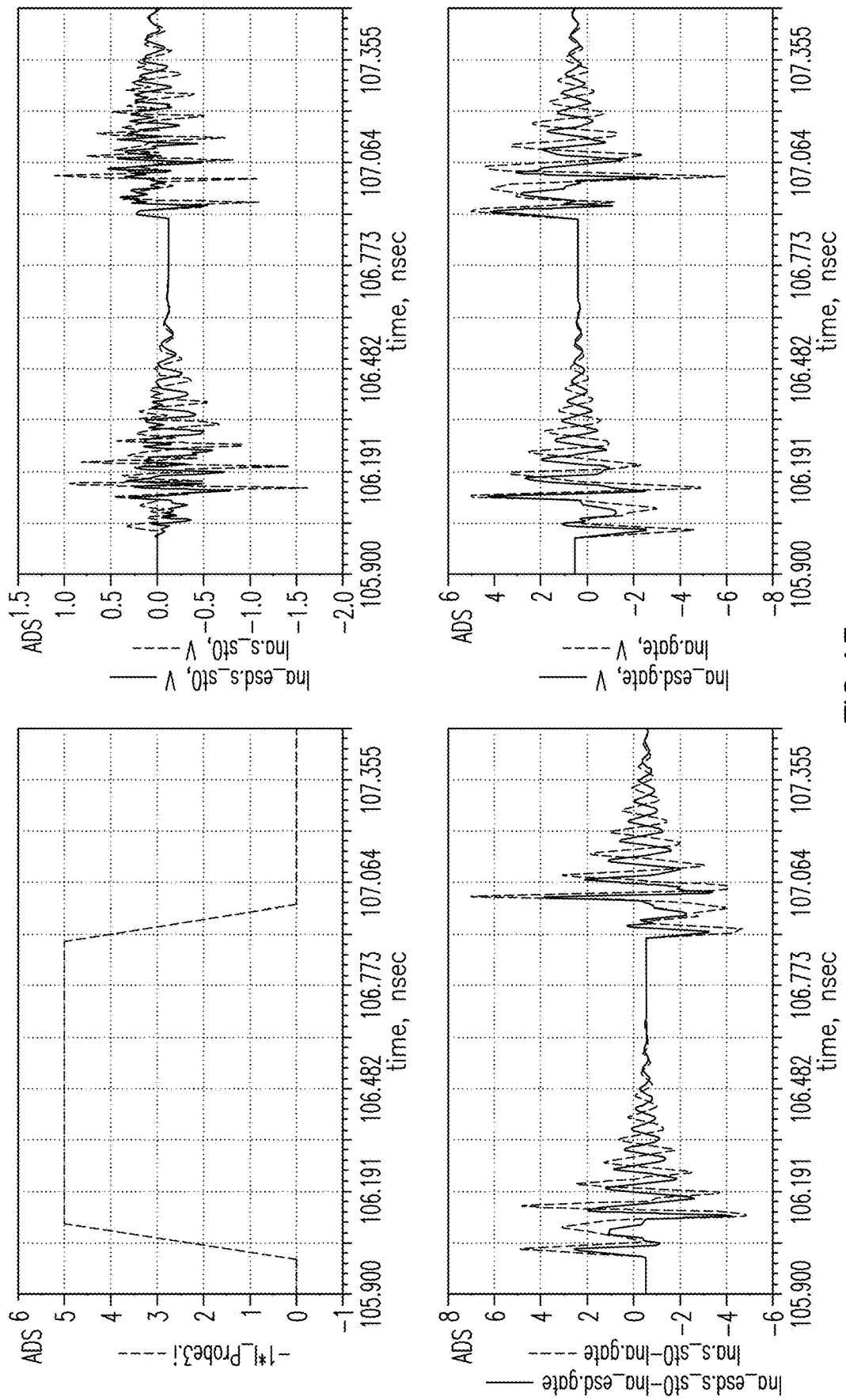
FIG. 13 is a graph of one example of simulation results showing a comparison of a millimeter wave amplifier implemented with and without protection inductors coupled to primary and secondary sections of a balun.

FIG. 13 is a graph of one example of simulation results showing a comparison of a millimeter wave amplifier implemented with and without protection inductors coupled to primary and secondary sections of a balun. As shown in FIG. 13, the simulated stress event is 5 Amps.

Figure 14:
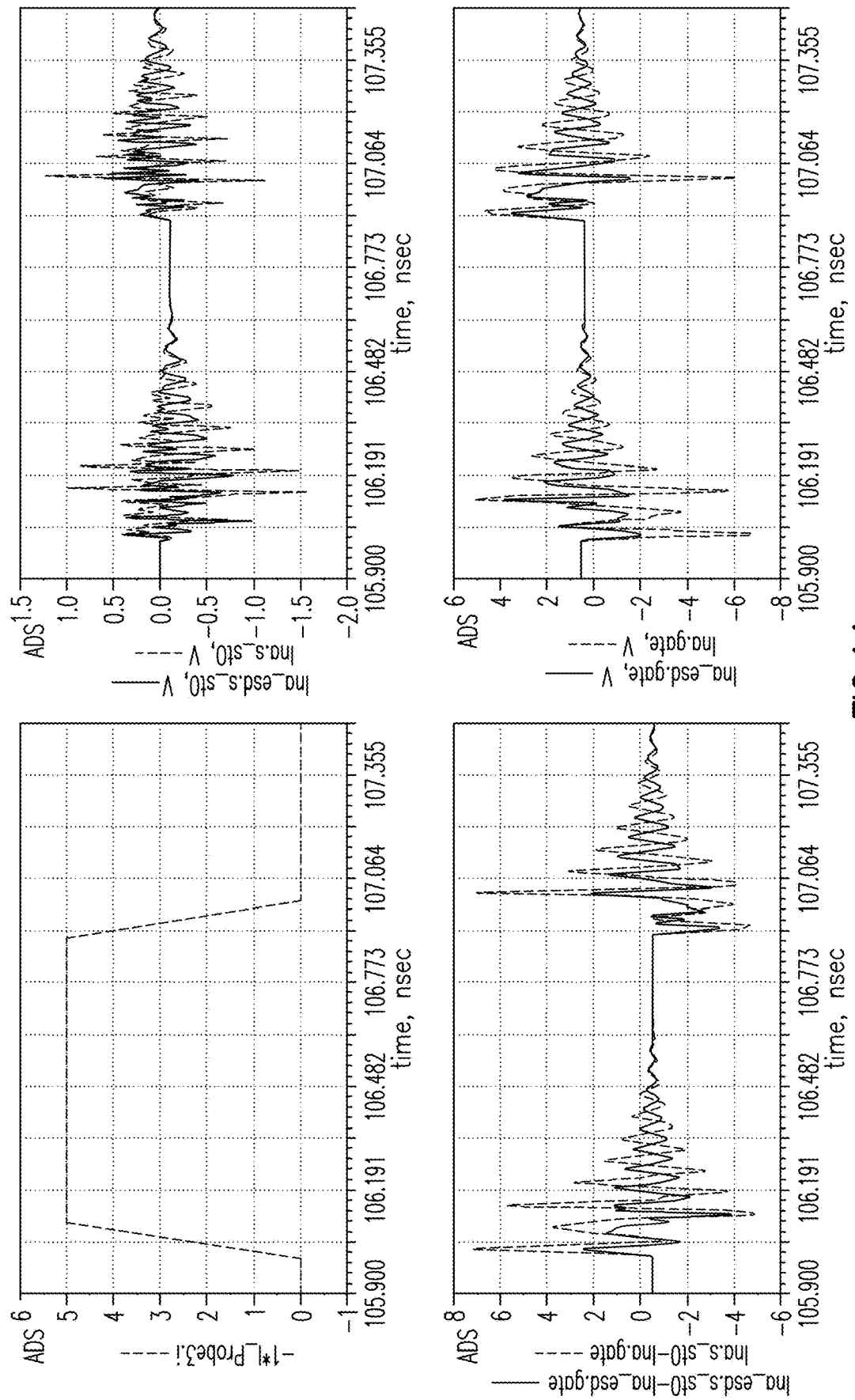
FIG. 14 is a graph of one example of simulation results showing a comparison of a millimeter wave amplifier implemented with and without gate-to-source clamps and protection inductors coupled to primary and secondary sections of a balun.

FIG. 14 is a graph of one example of simulation results showing a comparison of a millimeter wave amplifier implemented with and without gate-to-source clamps and protection inductors coupled to primary and secondary sections of a balun. As shown in FIG. 14, the simulated stress event is 5 Amps.

Figure 15:
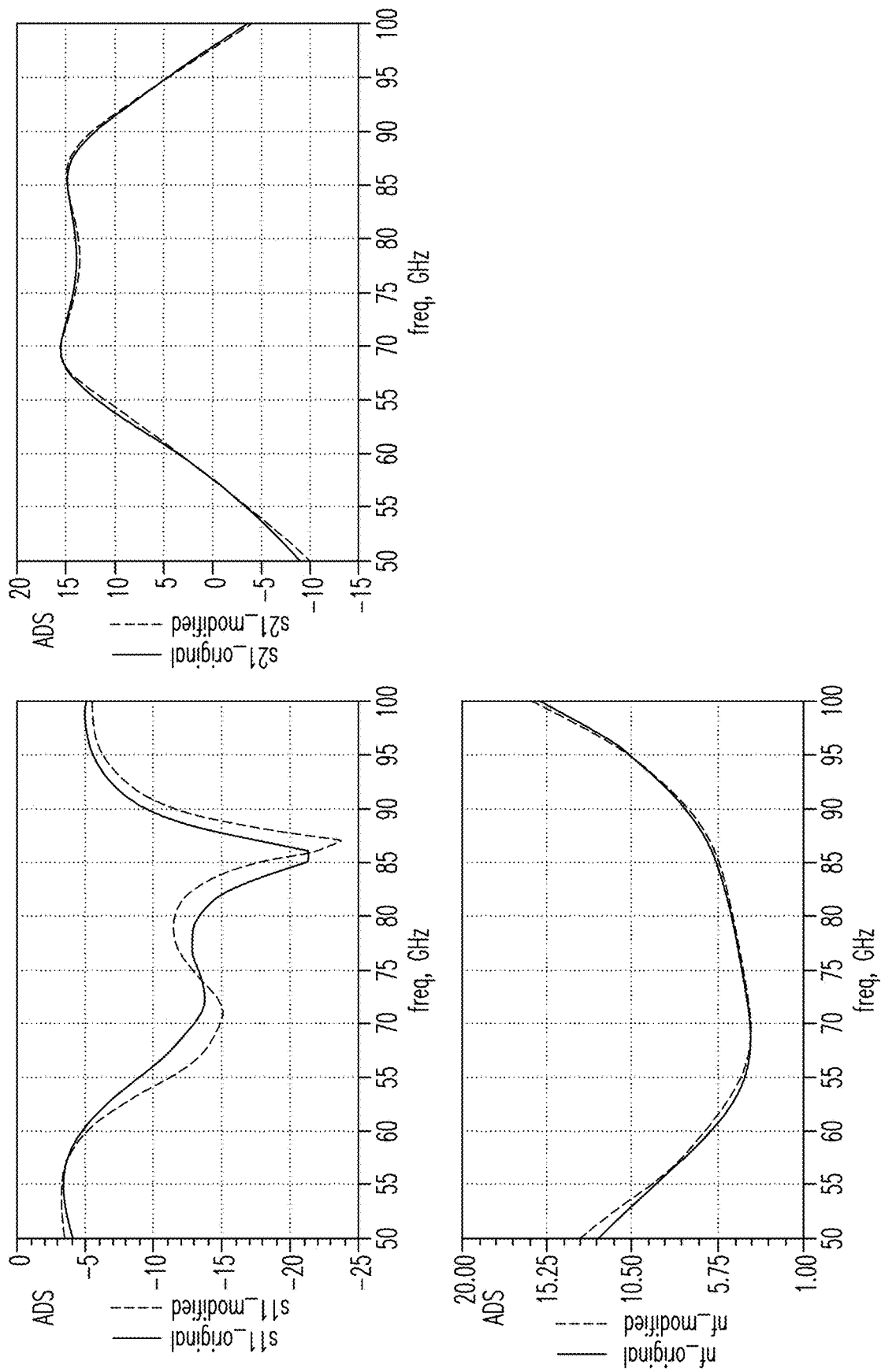
FIG. 15 is a graph of another example of simulation results showing a comparison of a millimeter wave amplifier implemented with and without a protection inductor coupled to a primary section of a balun.

FIG. 15 is a graph of another example of simulation results showing a comparison of a millimeter wave amplifier implemented with and without a protection inductor coupled to a primary section of a balun.

FIG. 16 is a graph of another example of simulation results showing a comparison of a millimeter wave amplifier implemented with and without protection inductors coupled to primary and secondary sections of a balun.

FIG. 17 is a graph of another example of simulation results showing a comparison of a millimeter wave amplifier implemented with and without gate-to-source clamps and protection inductors coupled to primary and secondary sections of a balun.

Although FIGS. 11-17 illustrates various examples of simulation results, other simulation results are possible, including results that depend on implementation, application, and/or processing technology.

Figure 18A:
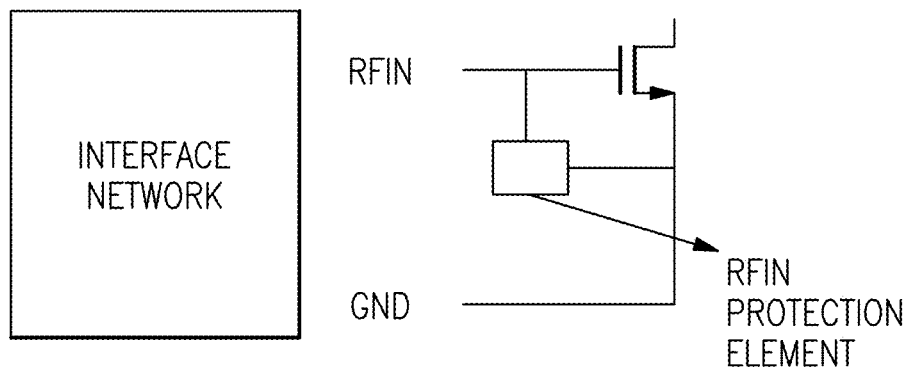
FIG. 18A is a schematic diagram of one embodiment of a compound semiconductor high electron mobile transistor (HEMT) coupled to an interface network and protected by a protection element.

FIG. 18A is a schematic diagram of one embodiment of a compound semiconductor HEMT coupled to an interface network and protected by a protection element. In certain implementations is an enhancement mode HEMT (E-HEMT), which can fail when negative polarity overstress occurs on the RF port with respect to ground. For example, the interface between the metal gate of the HEMT and the channel can operate as a Schottky diode that is stressed in the reverse direction and fails.

In such applications, RFIN ports may need protection only in one direction or polarity, for instance, against negative polarity overstress on the RF port with respect to ground (GND). Additionally, positive polarity overstress can be handed by the core HEMT gate-to-source diode.

Figure 18B:
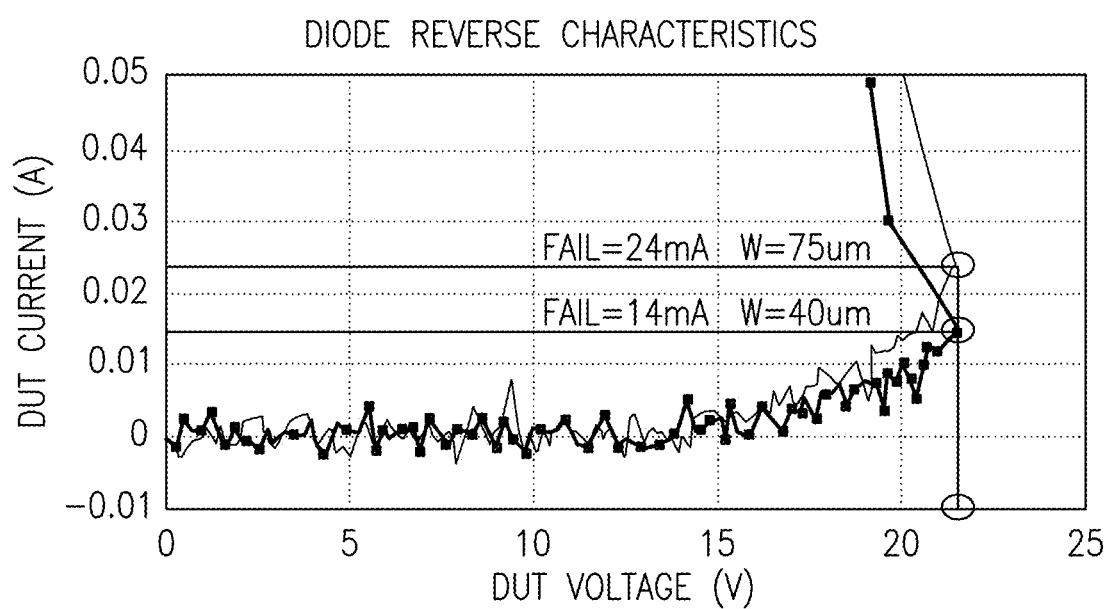
FIG. 18B is a graph of one example of voltage versus current characteristics for a Schottky gate diode structure of a HEMT.

FIG. 18B is a graph of one example of voltage versus current characteristics for a Schottky gate diode structure of a HEMT, such as the HEMT of FIG. 18. Often there is a larger design margin as compared with advanced CMOS, since the core Schottky junction being protected can have a relatively large breakdown voltage (BV), for instance, 15V or more. Although FIG. 18B illustrates an example of diode reverse characteristics, other results are possible.

Figure 19:
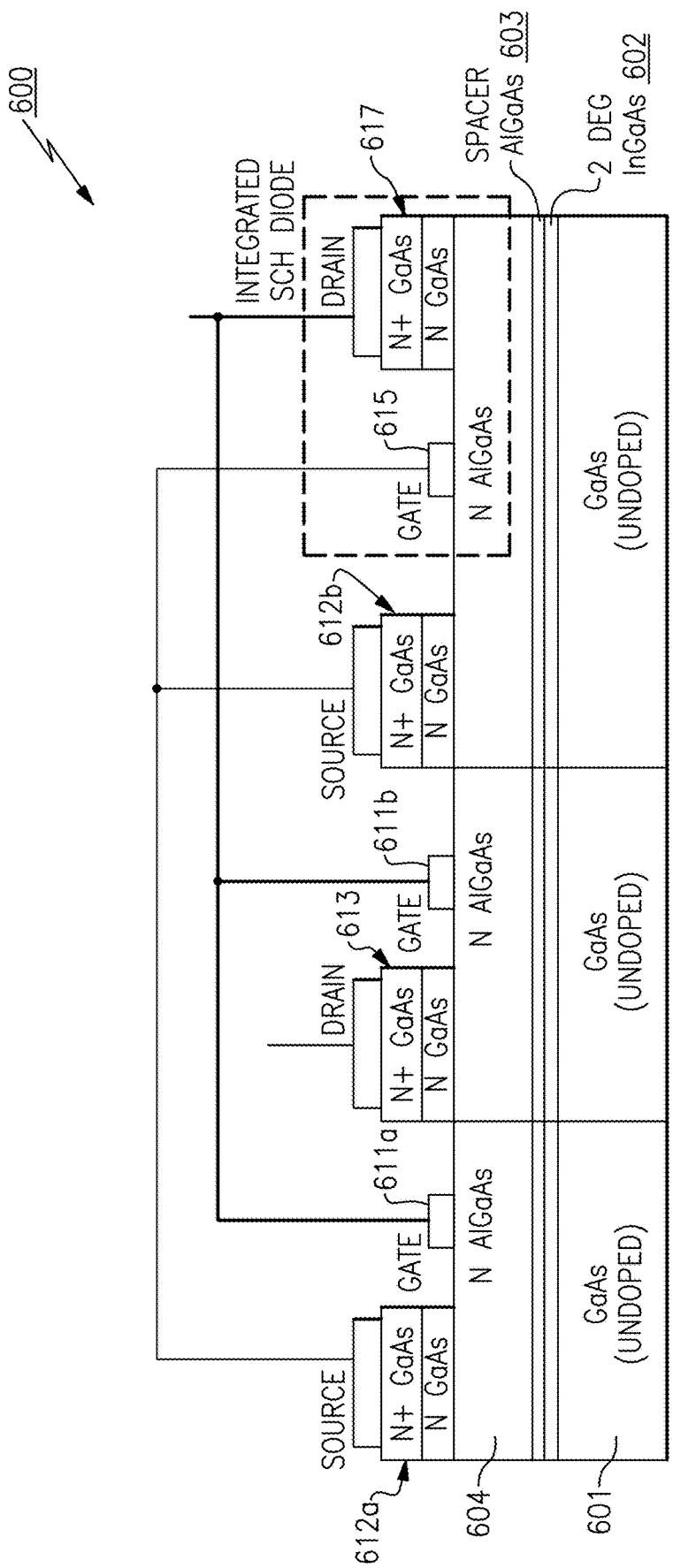
FIG. 19 is a cross-section of one embodiment of a HEMT.

FIG. 19 is a cross-section of one embodiment of a HEMT 600 with integrated protection. The HEMT is fabricated in a III-V compound semiconductor technology (GaAs, in this example). Although an example with GaAs is shown, the teachings herein are applicable to other processing technologies, such as Silicon and GaN.

To provide low capacitance overstress protection, an ESD protection component can be explicitly added between gate and source (for instance, see E-HEMT of FIG. 18A with gate-source protection).

Additionally or alternatively, an additional gate/drain stripe can be utilized within multi-stripe layouts to protect the Schottky gate.

For example, in the illustrated embodiment, the HEMT 600 is fabricated over an undoped GaAs substrate 601. Additionally, an InGaAs channel layer 602 (including, a two dimensional electron gas or 2 DEG region) is formed over the undoped GaAs substrate 601. Furthermore, an AlGaAs spacer layer 603 is formed over the InGaAs channel layer 602, and an N AlGaAs layer is formed over the AlGaAs spacer layer 603.

The HEMT 600 includes a first gate region 611a, a second gate region 611b, a drain region 613 positioned between the first gate region 611a and the second gate region 611b. The gate regions are formed of metal and are associated with metal-semiconductor interfaces and corresponding Schottky diodes. The HEMT 600 further includes a first source region 612a and a second source region 612b, with the first gate region 611a positioned between the first source region 612a and the drain region 613 and with the second gate region 611b positioned between the drain region 613 and the second source region 612b.

To protect the HEMT 600, and additional transistor finger has been included to provide a protection HEMT associated with a protection gate region 615, a protection drain region 617, and the source region 612b, which is shared by HEMT 600 and the protection HEMT. As shown in FIG. 19, the gate of the protection HEMT is connected in metal (back end metallization) to the source of the HEMT 600, while the drain of the protection HEMT is connected to the source of the HEMT 600.

Implementing the HEMT 600 in this manner provides an integrated Schottky diode between the gate and source of the HEMT 600.

Figure 20:
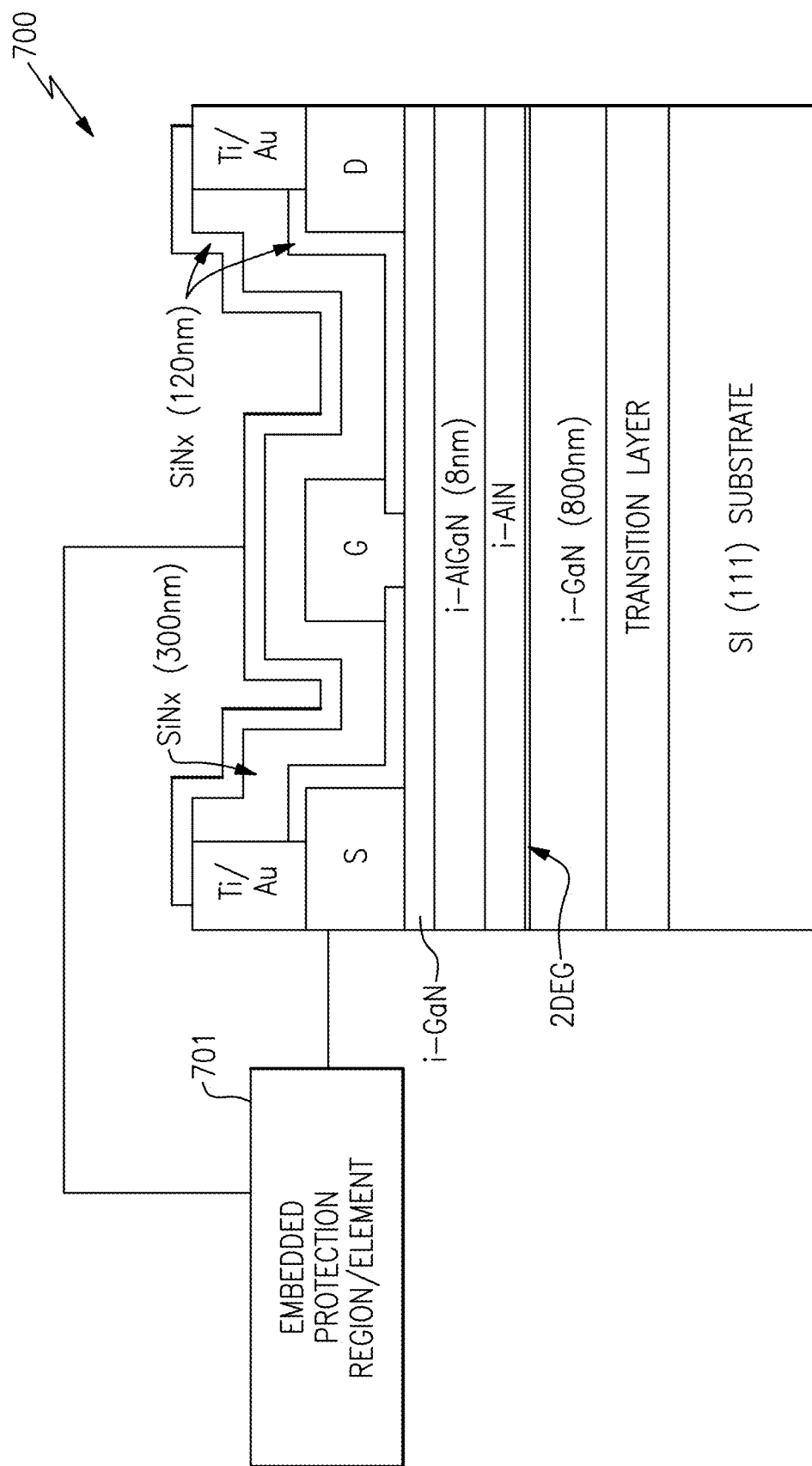
FIG. 20 is a cross-section of another embodiment of a HEMT.

FIG. 20 is a cross-section of another embodiment of a HEMT 700. As shown in FIG. 20, an embedded protection region and/or element 701 can be included between gate and source of the HEMT 700.

Although particular layers and materials are depicted, other implementations are possible. In one example, a Si substrate is omitted in favor of using a Silicon Carbide (SiC) substrate.

Applications

Devices employing the above described schemes can be implemented into various electronic devices. Examples of the electronic devices can include, but are not limited to, consumer electronic products, parts of the consumer electronic products, electronic test equipment, communication infrastructure applications, etc. Further, the electronic device can include unfinished products, including those for communication, industrial, medical, automotive, radar, and aerospace applications.

CONCLUSION

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while the disclosed embodiments are presented in a given arrangement, alternative embodiments may perform similar functionalities with different components and/or circuit topologies, and some elements may be deleted, moved, added, subdivided, combined, and/or modified. Each of these elements may be implemented in a variety of different ways. Any suitable combination of the elements and acts of the various embodiments described above can be combined to provide further embodiments. Accordingly, the scope of the present invention is defined only by reference to the appended claims.

Although the claims presented here are in single dependency format for filing at the USPTO, it is to be understood that any claim may depend on any preceding claim of the same type except when that is clearly not technically feasible.

The invention claimed is:

1. A monolithic microwave integrated circuit (MMIC) with integrated electrical overstress protection, the MMIC comprising:
   a radio frequency (RF) signal pad configured to receive an RF signal; and
   an RF circuit coupled to the RF signal pad, the RF circuit comprising a transistor layout, an input field-effect transistor (FET) implemented using a first portion of a plurality of gate fingers of the transistor layout, and an embedded protection device electrically connected between a gate and a source of the input FET and implemented using a second portion of the plurality of gate fingers.

2. The MMIC of claim 1, wherein the gate of the input FET receives the RF signal.

3. The MMIC of claim 2, further comprising a ground pad and a source inductor electrically connected between the source of the input FET and the ground pad.

4. The MMIC of claim 1, wherein the embedded protection device includes a Schottky diode having a first terminal electrically connected to the source of the input FET, and a second terminal electrically connected to the gate of the input FET.

5. The MMIC of claim 1, wherein the input FET is a high electron mobile transistor (HEMT).

6. The MMIC of claim 1, fabricated in a compound semiconductor technology.

7. The MMIC of claim 6, wherein the compound semiconductor technology is gallium arsenide (GaAs).

8. The MMIC of claim 1, further comprising a balun including a primary winding connected to the RF signal pad and a secondary winding connected to the RF circuit.

9. The MMIC of claim 8, further comprising a ground pad and a first protection inductor electrically connected between the primary section of the balun and the ground pad.

10. The MMIC of claim 9, wherein the first protection inductor is electrically connected to a center tap of the primary section.

11. The MMIC of claim 9, further comprising a second protection inductor electrically connected to the secondary section of the balun.

12. The MMIC of claim 8, further comprising an input inductor electrically connected between a first end of the secondary section of the balun and the gate of the input FET.

13. The MMIC of claim 1, wherein the RF circuit is an RF amplifier, and the input FET is configured to amplify the RF signal.

14. A method of protecting a monolithic microwave integrated circuit (MMIC) using integrated electrical overstress protection, the method comprising:
receiving a radio frequency (RF) signal from an RF signal pad;
providing the RF signal from the RF signal pad to an RF circuit that comprises a transistor layout and an input field-effect transistor (FET) implemented using a first portion of a plurality of gate fingers of the transistor layout; and
protecting the input FET using an embedded protection device electrically connected between a gate and a source of the input FET and implemented using a second portion of the plurality of gate fingers.

15. The method of claim 14, further comprising receiving the RF signal at the gate of the input FET.

16. The method of claim 14, further comprising amplifying the RF signal using the input FET.

17. The method of claim 14, wherein protecting the input FET using the embedded protection device includes providing protection using a Schottky diode having a first terminal electrically connected to the source of the input FET and a second terminal electrically connected to the gate of the input FET.

18. The method of claim 14, further comprising providing the RF signal from a primary winding of a balun electrically connected to the RF signal pad to a secondary winding electrically connected to the RF circuit.

19. The method of claim 18, further comprising providing protection using a first protection inductor electrically connected between the primary section of the balun and a ground pad.

20. The method of claim 19, further comprising providing protection using a second protection inductor electrically connected to the secondary section of the balun.

* * * * *